US009922692B2

(12) United States Patent
Koyama

(10) Patent No.: US 9,922,692 B2
(45) Date of Patent: Mar. 20, 2018

(54) SEMICONDUCTOR DEVICE INCLUDING REFRESH CIRCUIT FOR MEMORY CELL

(71) Applicant: SEMICONDUCTOR ENERGY LABORATORY CO., LTD., Atsugi-shi, Kanagawa-ken (JP)

(72) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/645,049

(22) Filed: Mar. 11, 2015

(65) Prior Publication Data

US 2015/0262642 A1 Sep. 17, 2015

(30) Foreign Application Priority Data

Mar. 13, 2014 (JP) ................. 2014-049981

(51) Int. Cl.
| | | |
|---|---|---|
| G11C 11/406 | (2006.01) | |
| G11C 11/4093 | (2006.01) | |
| G11C 11/24 | (2006.01) | |
| G11C 11/4091 | (2006.01) | |

(52) U.S. Cl.
CPC ............ *G11C 11/406* (2013.01); *G11C 11/24* (2013.01); *G11C 11/4091* (2013.01); *G11C 11/4093* (2013.01)

(58) Field of Classification Search
CPC .................................................. G11C 11/406
USPC ........................................................ 365/72
See application file for complete search history.

(56) References Cited

U.S. PATENT DOCUMENTS

| | | | |
|---|---|---|---|
| 4,466,081 | A | 8/1984 | Masuoka |
| 5,349,366 | A | 9/1994 | Yamazaki et al. |
| 5,731,856 | A | 3/1998 | Kim et al. |
| 5,744,864 | A | 4/1998 | Cillessen et al. |
| 6,127,702 | A | 10/2000 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Shukuri et al., IEDM 92: Technical Digest of International Electron Devices Meeting, "A Complementary Gain Cell Technology for Sub-1 V Supply DRAMs", Dec. 13, 1992, pp. 1006-1008.

(Continued)

*Primary Examiner* — Anthan Tran
*Assistant Examiner* — Mushfique Siddique
(74) *Attorney, Agent, or Firm* — Nixon Peabody LLP; Jeffrey L. Costellia

(57) ABSTRACT

To provide a semiconductor device which includes a novel refresh circuit in a memory including an oxide semiconductor film. As circuits which operate in a refresh operation of the memory including the oxide semiconductor film, a sense amplifier circuit, a latch circuit, a first switch, and a second switch are provided. In the refresh operation, a potential which reflects a potential stored in the memory is input to the sense amplifier circuit, an output of the sense amplifier circuit is input to the latch circuit, and an output of the latch circuit is written to the memory again through the first switch and a first transistor including an oxide semiconductor in a channel.

11 Claims, 15 Drawing Sheets

(56) References Cited

U.S. PATENT DOCUMENTS

| | | | |
|---|---|---|---|
| 6,233,187 B1* | 5/2001 | Tsuchiya | G11C 7/12 365/201 |
| 6,294,274 B1 | 9/2001 | Kawazoe et al. | |
| 6,314,017 B1 | 11/2001 | Emori et al. | |
| 6,327,210 B1 | 12/2001 | Kuroda et al. | |
| 6,445,026 B1 | 9/2002 | Kubota et al. | |
| 6,536,013 B2 | 3/2003 | Kobayashi et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager, III et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,375,399 B2 | 5/2008 | Ishii et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,082 B2 | 9/2010 | Iwasaki | |
| 7,859,889 B2 | 12/2010 | Kameshiro et al. | |
| 7,884,360 B2 | 2/2011 | Takechi et al. | |
| 7,888,207 B2 | 2/2011 | Wager, III et al. | |
| 8,363,452 B2* | 1/2013 | Yamazaki | G11C 11/405 365/145 |
| 8,406,038 B2* | 3/2013 | Saito | G11C 11/403 365/149 |
| 8,420,442 B2 | 4/2013 | Takechi et al. | |
| 8,421,090 B2 | 4/2013 | Choi | |
| 8,514,609 B2* | 8/2013 | Kawae | G11C 11/405 365/149 |
| 8,530,246 B2 | 9/2013 | Ofuji et al. | |
| 2001/0006480 A1* | 7/2001 | Sato | G11C 11/56 365/189.05 |
| 2001/0046027 A1 | 11/2001 | Tai et al. | |
| 2002/0041521 A1* | 4/2002 | Park | G11C 7/06 365/189.05 |
| 2002/0056838 A1 | 5/2002 | Ogawa | |
| 2002/0132454 A1 | 9/2002 | Ohtsu et al. | |
| 2003/0123313 A1 | 7/2003 | Hanzawa et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0266088 A1 | 12/2004 | Luyken et al. | |
| 2005/0017302 A1 | 1/2005 | Hoffman | |
| 2005/0128803 A1 | 6/2005 | Luk et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0020586 A1* | 1/2010 | Ivanov | G11C 11/404 365/72 |
| 2010/0065844 A1 | 3/2010 | Tokunaga | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2011/0089417 A1 | 4/2011 | Yamazaki et al. | |
| 2011/0122670 A1* | 5/2011 | Yamazaki | G11C 16/0433 365/72 |
| 2011/0176348 A1* | 7/2011 | Yamazaki | G11C 11/404 365/72 |
| 2011/0210339 A1 | 9/2011 | Yamazaki et al. | |
| 2011/0255325 A1* | 10/2011 | Nagatsuka | G11C 11/405 365/72 |
| 2011/0280061 A1* | 11/2011 | Saito | G11C 11/403 365/149 |
| 2012/0039126 A1 | 2/2012 | Saito | |
| 2012/0051120 A1* | 3/2012 | Kamata | G11C 11/404 365/149 |
| 2012/0063204 A1* | 3/2012 | Kamata | G11C 16/0466 365/149 |
| 2012/0069634 A1 | 3/2012 | Saito | |
| 2013/0181216 A1 | 7/2013 | Saito et al. | |
| 2013/0237012 A1 | 9/2013 | Takechi et al. | |

(56) References Cited

U.S. PATENT DOCUMENTS

| | | | |
|---|---|---|---|
| 2014/0167041 A1 | 6/2014 | Yamazaki et al. | |
| 2015/0187407 A1* | 7/2015 | Kim | G11C 11/4093 365/72 |
| 2015/0348608 A1* | 12/2015 | Matsuzaki | G11C 11/4074 365/222 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-211084 | 8/1995 |
| JP | 08-264794 A | 10/1996 |
| JP | 11-505377 | 5/1999 |
| JP | 11-233789 | 8/1999 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181167 | 9/2011 |
| JP | 2013-191265 | 9/2013 |
| WO | WO-2004/114391 | 12/2004 |
| WO | WO 2011-096264 | 8/2011 |

OTHER PUBLICATIONS

Shukuri et al., IEEE Transactions on Electron Devices, A Semi-Static Complementary Gain Cell Technology for Sub-1 V Supply DRAM's, Jun. 1, 1994, vol. 41, No. 6, pp. 926-931.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper Transparent Amorphous Oxide Semiconductor for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al. "39.1:Invited Paper:Optically Isotrophic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabalized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabalized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu,or Zn] at Temperatures Over 1000° C.", Journal of Solid State Chemistry, 1985, vol. 60, pp. 382-384.

Kimikuza.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholestric Liquid Crystals", Phys. Rev. Lett. (Phyical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo. Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display with Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Ishii et al., "A Poly-Silicon TFT with a Sub-5-nm Thick Channel for Low-Power Gain Cell Memory in Mobile Applications", IEEE Transactions on Electron Device, Nov. 1, 2004, vol. 51, No. 11, pp. 1805-1810.
Kim et al., "An Experimental High-Density DRAM Cell with a Built-in Gain Stage", IEEE Journal of Solid-State Circuits, Aug. 1, 1994, vol. 29, No. 8, pp. 978-981.
Shukuri et al., "A Complementary Gain Cell Technology for Sub-1V Supply DRAMs", Dec. 13, 1992, pp. 1006-1008.
Shukuri et al., "A Semi-Static Complementary Gain Cell Technology for Sub-1 Supply DRAM's", Jun. 1, 1994, vol. 41, No. 6, pp. 926-931.

\* cited by examiner

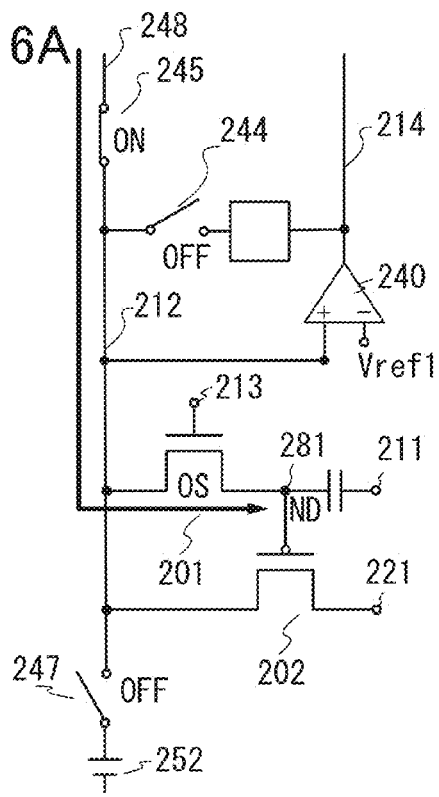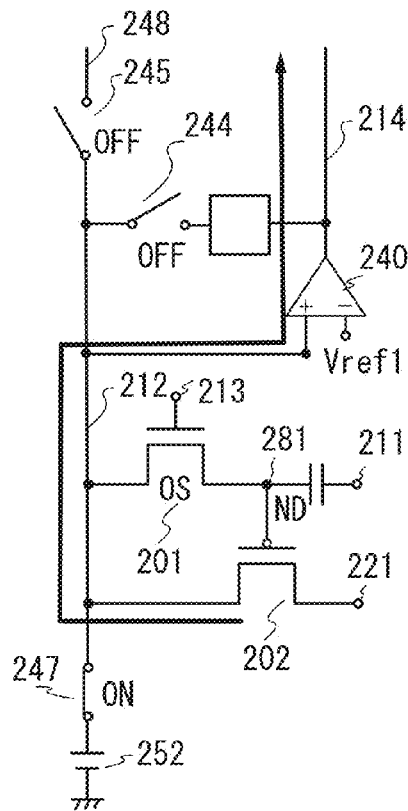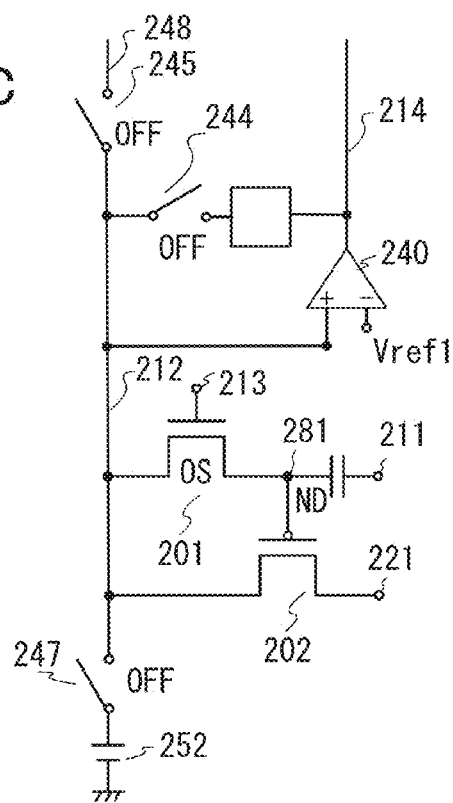

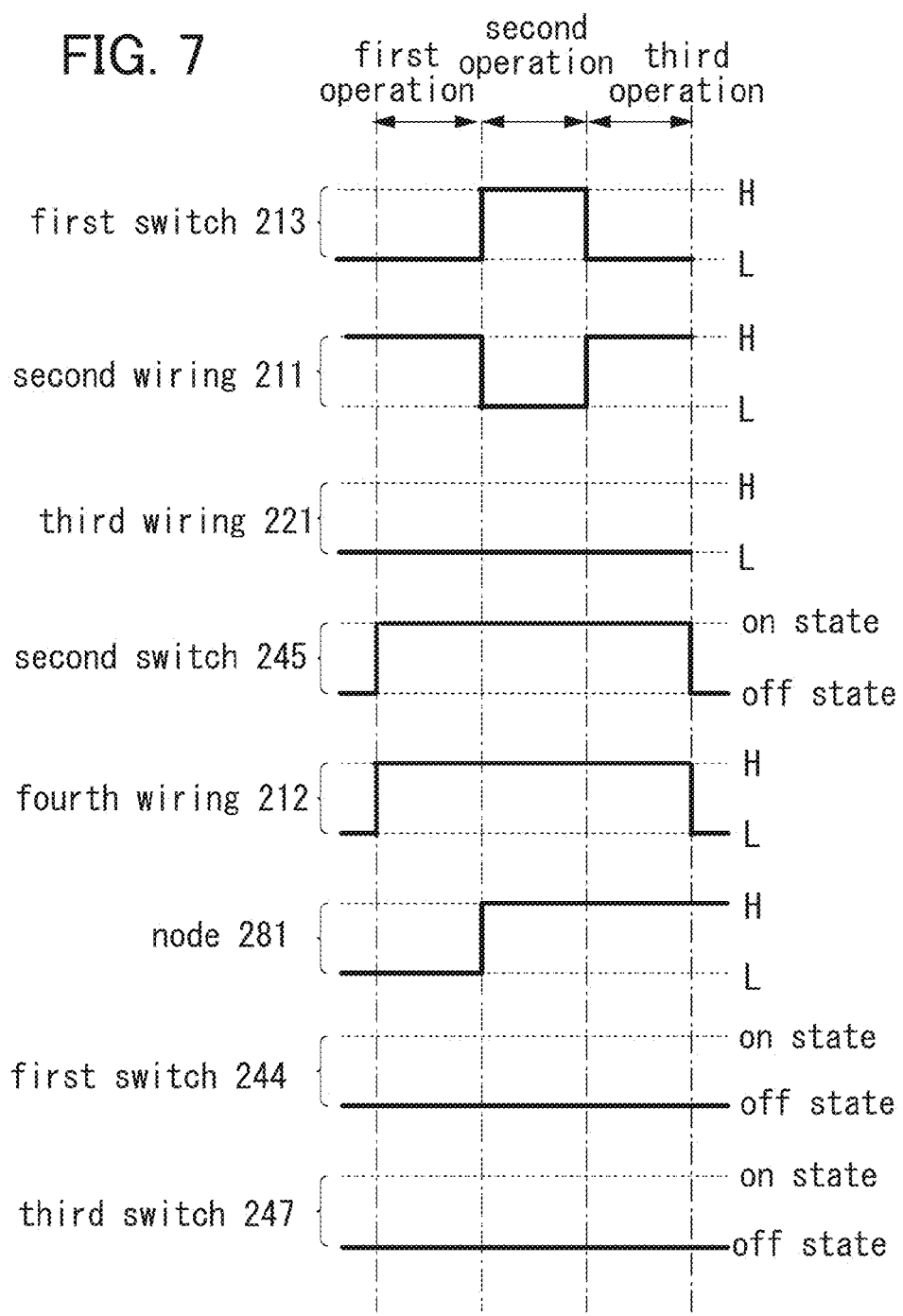

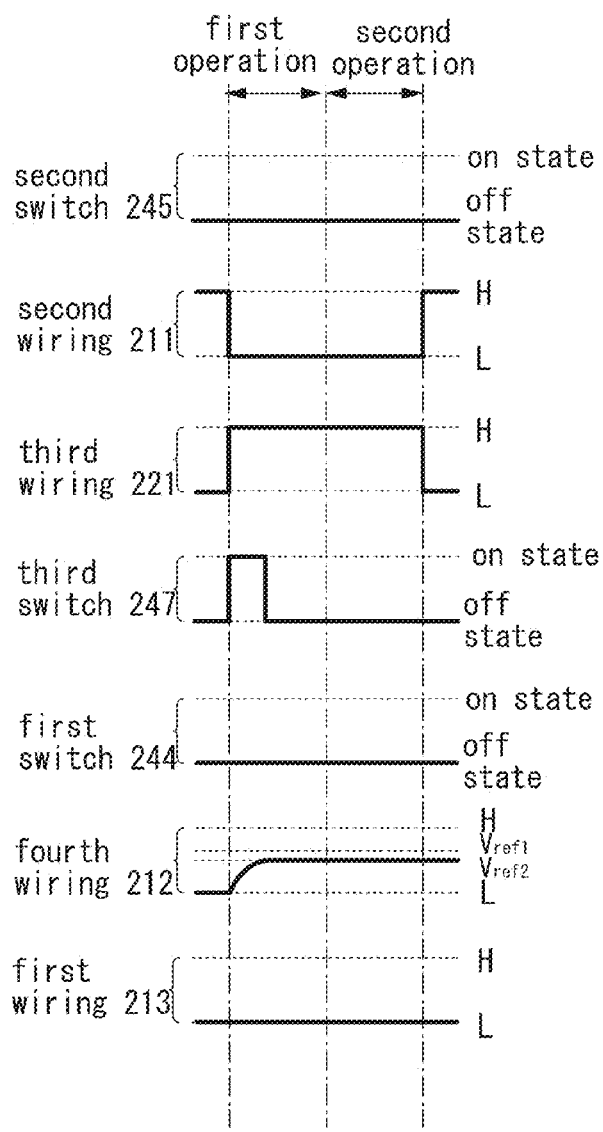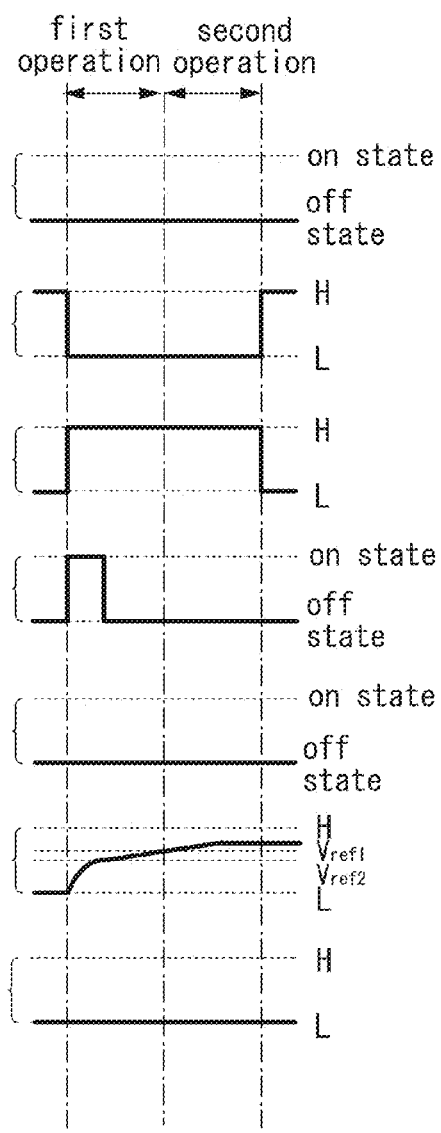

CAAC-OS nc-OS as-sputtered     after heat treatment at 450°C

☐ proportion of non-CAAC     ☰ proportion of CAAC as-sputtered after heat treatment at 450°C

SEMICONDUCTOR DEVICE INCLUDING REFRESH CIRCUIT FOR MEMORY CELL

BACKGROUND OF THE INVENTION

1. Field of the Invention

One embodiment of the present invention relates to a memory device or a semiconductor device which includes a memory cell capable of holding data temporarily even when supply of power is stopped. One embodiment of the present invention relates to an electronic device which includes the memory device or the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for driving any of them, and a method for manufacturing any of them.

2. Description of the Related Art

Memories such as an SRAM and a DRAM have already been used in a variety of electronic devices. For example, an SRAM or a DRAM is widely used as a cache memory. A cache memory is used in a central processing unit (CPU), a hard disk drive (HDD), a solid state drive (SSD), or the like. A cache memory is provided to input or output data to a logic circuit quickly.

Current electronic devices are required to reduce power consumption. For example, there is power gating, which allows reduction in power consumption in such a manner that power supply to circuits which are not used is stopped and power is supplied to circuits which are used as appropriate in an electronic device including a plurality of circuits.

In contrast, since an SRAM and a DRAM are volatile memories, data is erased when the power is turned off. Therefore, when power gating is performed on an SRAM or a DRAM, data stored in the SRAM or the DRAM is erased; therefore, data needs to be written again after the power is turned on, leading to the delay of the response. For this reason, a nonvolatile memory is required.

Although an example of nonvolatile memories includes a flash memory, response speed of a flash memory is low. As a novel memory, a memory using an oxide semiconductor has been proposed.

The off-state current of an FET using an oxide semiconductor is extremely low. For example, the off-state current per micrometer of the channel width at 85° C. is less than or equal to 100 yA (1 yA (yoctoampere) is $1 \times 10^{-24}$ A). Thus, a memory element which can hold data for a long period can be formed using an oxide semiconductor FET and a capacitor (e.g., Patent Document 1).

Even if the retention period of a memory using an oxide semiconductor is as long as over 10 years, a so-called refresh operation, in which charge is stored in a capacitor of a memory again, is in demand in order to achieve a longer period of data holding.

A technique of controlling the threshold value of an oxide semiconductor FET is still under development. In the case where the threshold value is shifted in the negative direction, the off-state current is increased at Vg=0 V. Owing to the shift in the threshold value, a data retention period is shortened. Therefore, a refresh operation in which charge is stored in a capacitor of a memory again is required for lengthening a data retention period.

There is a method in which through regular refresh operations, charge is stored in a capacitor of a memory using an oxide semiconductor again so that a data retention period is lengthened (e.g., Patent Document 2).

REFERENCE

Patent Document

[Patent Document 1] Japanese Published Patent Application No. 2011-181167
[Patent Document 2] Japanese Published Patent Application No. 2013-191265

SUMMARY OF THE INVENTION

The refresh circuit described in Patent Document 2 is used for a memory cell in which write bit lines WBL and read bit lines RBL are separately provided. Therefore, the refresh circuit described in Patent Document 2 cannot be used for a memory cell in which write bit lines and read bit lines are shared such as one described in Patent Document 1.

An object is to provide a memory device including a novel refresh circuit. Another object is to provide a semiconductor device including a novel refresh circuit. Another object is to provide an electronic device including a memory device or a semiconductor device which includes a novel refresh circuit. Another object is to provide a novel memory device, a novel semiconductor device, or a novel electronic device.

Another object is to provide a memory device or a semiconductor device capable of performing a refresh operation even in a memory cell in which write bit lines and read bit lines are the same lines. Another object is to provide a memory device or a semiconductor device capable of reducing power consumption significantly. Another object is to provide a memory device or a semiconductor device capable of high-speed operation.

One embodiment of the invention disclosed in this specification achieves at least one of the above objects.

Note that the descriptions of these objects do not disturb the existence of other objects. In one embodiment of the present invention, there is no need to achieve all the objects. One embodiment of the invention disclosed in this specification achieves at least one of the above objects. Other objects are apparent from and can be derived from the description of the specification, the drawings, and the claims.

One embodiment of the present invention is a semiconductor device including a memory cell, a sense amplifier circuit, a latch circuit, a first switch, a second switch, and a driver circuit. The sense amplifier circuit, the latch circuit, the first switch, and the second switch operate in a refresh operation of the memory cell. The memory cell includes a first transistor, a second transistor, and a capacitor. The first transistor includes an oxide semiconductor in a channel formation region. One of a source and a drain of the first transistor is electrically connected to a first wiring. The other of the source and the drain of the first transistor is electrically connected to one terminal of the capacitor. The other of the source and the drain of the first transistor is electrically connected to a gate of the second transistor. One of a source and a drain of the second transistor is electrically connected to the first wiring. A gate of the first transistor is electrically connected to a second wiring. The other terminal of the capacitor is electrically connected to a third wiring. The other of the source and the drain of the second transistor is electrically connected to a fourth wiring. A first input terminal of the sense amplifier circuit is electrically connected to the first wiring. An output terminal of the sense amplifier circuit is electrically connected to an input terminal of the latch circuit. An output terminal of the latch circuit is electrically connected to one terminal of the first switch. The other terminal of the first switch is electrically connected to the first wiring. One terminal of the second switch is electrically connected to the first wiring. The other terminal of the second switch is electrically connected to the driver circuit.

According to one embodiment of the present invention, in the refresh operation, when a first potential is the potential of the first wiring which reflects the potential of the gate of the second transistor, the first potential is input to the first input terminal of the sense amplifier circuit. When the first potential is input to the sense amplifier circuit, the sense amplifier circuit outputs a signal to the latch circuit. An output of the sense amplifier circuit is input to the latch circuit, and a latch operation is performed. After the latch operation is performed, a second potential, which is an output of the latch circuit, is input to the gate of the second transistor and the one terminal of the capacitor through the first switch, the first wiring, and the first transistor. One embodiment of the present invention is a semiconductor device which performs the above operations.

It is possible to provide a memory device or a semiconductor device which achieves a longer data retention period by a circuit or a refresh operation disclosed in the present invention. It is possible to provide a memory device or a semiconductor device capable of performing a refresh operation in a memory cell in which write bit lines and read bit lines are the same lines.

It is possible to provide a memory device or a semiconductor device whose power consumption is reduced. It is possible to provide a memory device or a semiconductor device capable of high-speed operation. It is possible to provide a novel memory device or a novel semiconductor device. Note that the description of these effects does not disturb the existence of other effects. One embodiment of the present invention does not necessarily achieve all the above effects. Other effects will be apparent from and can be derived from the description of the specification, the drawings, the claims, and the like.

BRIEF DESCRIPTION OF THE DRAWINGS

In the accompanying drawings:
FIGS. 6A to 6C each are a circuit diagram of a semiconductor device;
FIG. 7 is a timing chart of operations of a semiconductor device;
FIGS. 8A and 8B are timing charts of operations of a semiconductor device.

DETAILED DESCRIPTION OF THE INVENTION

Figure 1:
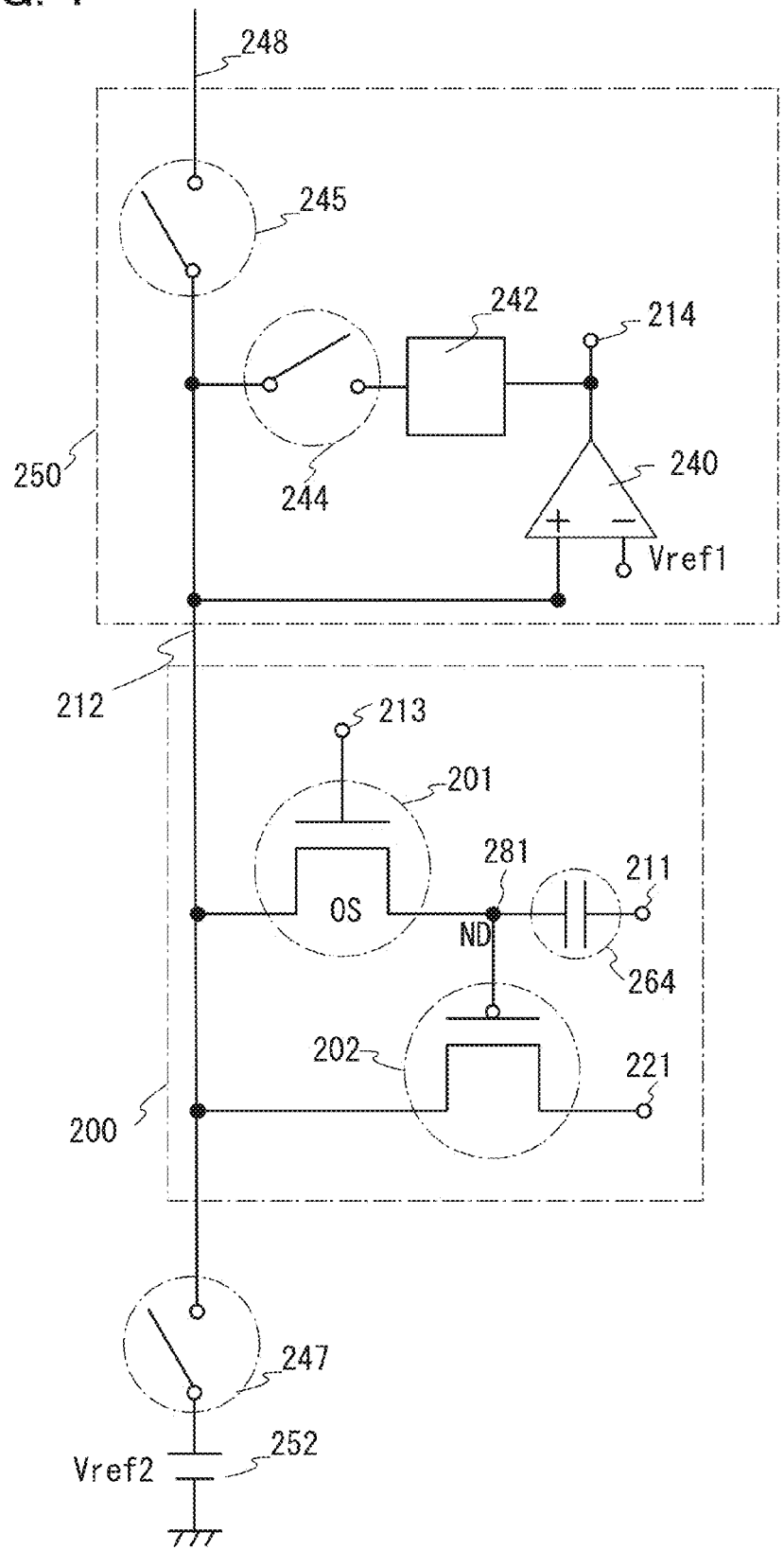
FIG. 1 is a circuit diagram of a semiconductor device.

Examples of embodiments of the present invention will be described below with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

A transistor is a kind of semiconductor element and can achieve amplification of current or voltage, a switching operation for controlling conduction or non-conduction, or the like. A transistor in this specification includes an insulated-gate field effect transistor (IGFET) and a thin film transistor (TFT).

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

In this specification and the like, ordinal numbers such as "first", "second", and "third" are used in order to avoid confusion among components, and the terms do not mean limitation of the number of components.

Embodiment 1

In this embodiment, a circuit configuration and operations of a semiconductor device (memory device) which is one embodiment of the disclosed invention will be described with reference to FIG. 1, FIG. 2, and FIG. 3. In this embodiment, an n-type transistor (n-channel transistor) is used as an oxide semiconductor transistor in a memory cell and a p-type transistor (p-channel transistor) is used as a silicon transistor in the memory cell. Note that the silicon transistor may be an n-type transistor (n-channel transistor).

In FIG. 1, the circuit configuration of the semiconductor device disclosed in this embodiment is illustrated. The semiconductor device in FIG. 1 includes a memory cell 200 and a circuit 250 which operates when charge is stored in a capacitor in the memory cell 200, i.e., in a refresh operation.

The memory cell 200 includes a first transistor 201, a second transistor 202, and a capacitor 264. A first wiring 213 and a gate of the first transistor 201 are electrically connected to each other. One of a source and a drain of the first transistor 201, a gate of the second transistor 202, and one terminal of the capacitor 264 are electrically connected to one another. The other terminal of the capacitor 264 and a second wiring 211 are electrically connected to each other. One of a source and a drain of the second transistor 202 and a third wiring 221 are electrically connected to each other. The other of the source and the drain of the first transistor 201 and the other of the source and the drain of the second transistor 202 are electrically connected to a fourth wiring 212 (also referred to as a bit line). The first transistor 201 functions as a write transistor, and the second transistor 202 functions as a read transistor. In the semiconductor device in FIG. 1, the first transistor 201 for writing and the second transistor 202 for reading share the fourth wiring 212.

As the first transistor 201 for writing, a transistor including an oxide semiconductor is used. The transistor including the oxide semiconductor has a characteristic of an extremely low leakage current between a source and a drain in an off state (an extremely low off-state current). Thus, by turning off the first transistor 201, charge can be held for an extremely long period at a node 281 (also referred to as a node ND) where the one of the source and the drain of the first transistor 201, the gate of the second transistor 202, and the one terminal of the capacitor 264 are electrically connected to one another. The capacitor 264 facilitates holding of charge given to the node 281 and reading of the held data. Since the first transistor 201 includes an oxide semiconductor, the first transistor 201 is also denoted by OS in FIG. 1.

The circuit 250 includes a sense amplifier circuit 240, a latch circuit 242, a first switch 244, and a second switch 245. A first input terminal of the sense amplifier circuit 240 is electrically connected to the fourth wiring 212, and a second input terminal of the sense amplifier circuit 240 is supplied with a reference potential Vref1. An output terminal of the sense amplifier circuit 240 outputs a high signal when the potential of the first input terminal is higher than the reference potential Vref1, and outputs a low signal when the potential of the first input terminal is lower than the reference potential Vref1.

The output terminal of the sense amplifier circuit 240 is electrically connected to one terminal of the first switch 244 through the latch circuit 242. Furthermore, the output terminal of the sense amplifier circuit 240 is electrically connected to a fifth wiring 214. The other terminal of the first switch 244 is electrically connected to the fourth wiring 212.

The second switch 245 is a switch for controlling input and non-input of a signal from a driver circuit to the memory cell 200 through a sixth wiring 248. One terminal of the second switch 245 is electrically connected to the memory cell 200 through the fourth wiring 212, and the other terminal of the second switch 245 is electrically connected to the driver circuit (not illustrated) through the sixth wiring 248. The third switch 247 is a switch for controlling whether a power source 252 is electrically connected to the fourth wiring 212. One terminal of the third switch 247 is electrically connected to the power source 252, and the other terminal of the third switch 247 is electrically connected to the memory cell 200 and the circuit 250 through the fourth wiring 212. The potential of the power source 252 is referred to as Vref2, and an inequality Vref1>Vref2 is satisfied.

Each of the first switch 244, the second switch 245, and the third switch 247 may be a transistor having three terminals.

Figure 2:
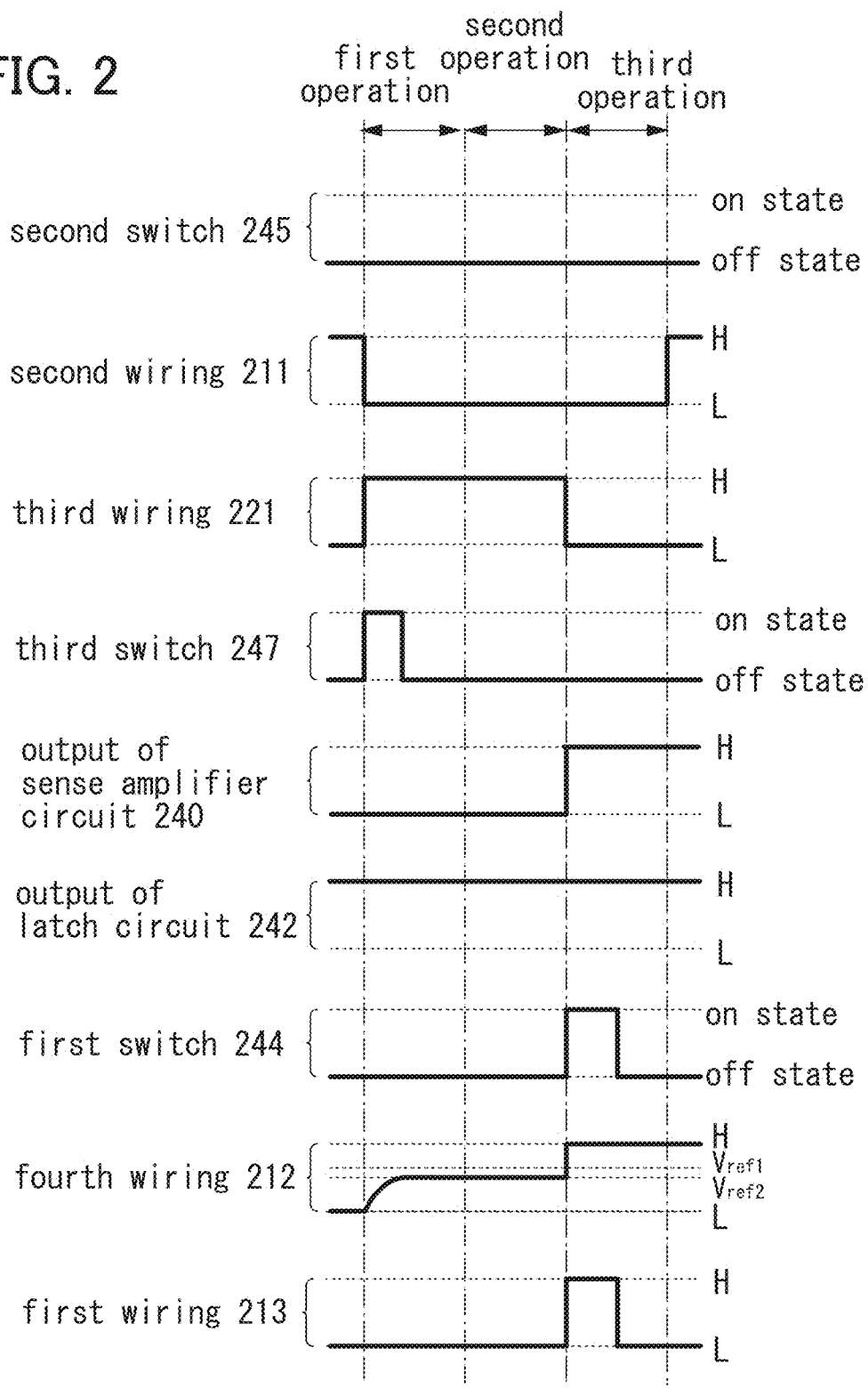
FIG. 2 is a timing chart of operations of a semiconductor device.

A procedure in which a refresh operation is performed from a state where a high-level potential is held at the node 281 in the memory cell 200 is described using a timing chart in FIG. 2.

First, the second switch 245 is turned off so that a signal is not input from the driver circuit to the memory cell 200 through the sixth wiring 248. The second switch 245 remains off during the refresh operation.

Next, in a first operation, the potential of the second wiring 211 is set to a low level and the potential of the third wiring 221 is set to a high level, so that the third switch 247 is turned on at substantially the same time. Since the third switch 247 is turned on, the fourth wiring 212 and the power source 252 are electrically connected to each other; thus, the fourth wiring 212 is precharged to the potential Vref2 from the power source 252. Although a high-level potential is stored at the node 281, which is the gate of the second transistor 202, the potential of the third wiring 221 is at a high level, that is, the source of the second transistor 202 is also at a high level; thus, the second transistor 202 is turned off.

In the first operation, the potential Vref2 is supplied from the power source 252 to the fourth wiring 212. When the precharge is finished, the third switch 247 is turned off.

In a second operation, an output of the sense amplifier circuit 240 and an output of the latch circuit 242 depending on the potential of the fourth wiring 212 are obtained. The potential of the fourth wiring 212 is input to the first input terminal of the sense amplifier circuit 240. Since the potential of the fourth wiring 212 is Vref2, which is lower than the reference potential Vref1, the sense amplifier circuit 240 outputs a low signal. The low signal output from the sense amplifier circuit 240 is input to the latch circuit 242. The signal input to the latch circuit 242 is held in the latch circuit 242 for a certain period. Since an inverter is incorporated in the latch circuit 242, after the low signal input to the latch circuit is held for a certain period, the low signal is inverted and output as a high signal.

In a third operation, the first switch 244 is turned on, so that the potential of the first wiring 213 is set to a high level. When the potential of the first wiring 213 is set to the high level, the first transistor 201 is turned on. The output terminal of the latch circuit 242 and the fourth wiring 212 are electrically connected to each other through the first switch 244. The high-level potential output from the latch circuit 242 is supplied to the fourth wiring 212, and the high-level potential of the fourth wiring 212 is supplied to the node 281 through the first transistor 201 to be stored in the capacitor 264. When the supply of the high-level potential to the node 281 is finished, the first switch 244 is turned off, and the potential of the first wiring 213 is set to a low level, so that the first transistor 201 is turned off. Through the above procedure, the refresh operation is finished.

In the case where an input from the sense amplifier circuit 240 to the latch circuit 242 is not inverted as the output of the latch circuit 242, the potential of the node 281 before the refresh operation and a potential input from the circuit 250 to the node 281 through the fourth wiring 212 by the refresh operation have opposite phases. Therefore, to perform the refresh operation reliably, it is important to invert an input as an output in the latch circuit 242. If a signal is not inverted in the latch circuit 242, the signal may be inverted in a current path through which the potential output from the sense amplifier circuit 240 is supplied to the node 281. Alternatively, an inverter or the like which inverts a signal may be incorporated in the sense amplifier circuit 240 so that an input from the first input terminal is inverted as an output of the sense amplifier circuit 240.

As shown in FIG. 2, the potential of the fourth wiring 212 is Vref2 until the second operation and is lower than the reference potential Vref1 input to the sense amplifier circuit 240. Since a high signal output from the latch circuit 242 is supplied to the fourth wiring 212 in the third operation, the potential input to the first input terminal of the sense amplifier circuit 240 is also set to a high level. In this case, the potential Vref2 input to the first input terminal of the sense amplifier circuit 240 is lower than Vref1 in the second operation, and the potential input to the first input terminal is higher than Vref1 in the third operation; thus, the output of the sense amplifier circuit 240 is inverted from a low level to a high level. However, since the first output from the sense amplifier circuit 240 in the second operation is already taken in the latch circuit 242, the output of the latch circuit 242 is not affected by a change in the output of the sense amplifier circuit 240. In other words, when the output of the sense amplifier circuit 240 is latched by the latch circuit 242, the data stored at the node 281 can be reliably written again.

A procedure in which a refresh operation is performed from a state where a low-level potential is held at the node 281 is described with reference to FIG. 3.

First, the second switch 245 remains off during the refresh operation. In a first operation, the potential of the second wiring 211 is set to a low level and the potential of the third wiring 221 is set to a high level, so that the third switch 247 is turned on at substantially the same time. Since the third switch 247 is turned on, the fourth wiring 212 and the power source 252 are electrically connected to each other; thus, the fourth wiring 212 is precharged from the power source 252. The steps described so far are the same as those in FIG. 2.

Next, the second transistor 202 is turned on since the low-level potential is stored at the node 281, which is the gate of the second transistor 202. By turning on the second transistor 202, current flows from the second transistor 202 to the fourth wiring 212; however, the potential of the fourth wiring 212 remains Vref2 because the power source 252 absorbs the current. When the precharge is finished and the third switch 247 is turned off, the potential of the fourth wiring 212 is increased since the current flows from the second transistor 202 to the fourth wiring 212.

While the third switch 247 is on in the first operation, the precharge potential Vref2 is supplied from the power source 252 to the fourth wiring 212. Next, when the third switch 247 is turned off in the first operation, the potential of the fourth wiring 212 is further increased to be higher than the precharge potential Vref2 owing to the current from the second transistor 202.

When the potential of the fourth wiring 212 is higher than the reference potential Vref1, the sense amplifier circuit 240 whose first input terminal is supplied with the potential of the fourth wiring 212 outputs a signal in a second operation. Since the potential of the fourth wiring 212 (the potential of the first input terminal) is higher than the reference potential Vref1, the sense amplifier circuit 240 outputs a high signal. The high signal output from the sense amplifier circuit 240 is input to and held in the latch circuit 242 for a certain period. After a signal is held in the latch circuit 242 for a certain period, a low signal which is inverted is output from the latch circuit 242 incorporating the inverter.

In a third operation, the first switch 244 is turned on, and the potential of the first wiring 213 is set to a high level, so that the first transistor 201 is turned on. Thus, the output potential of the latch circuit 242 is supplied to the node 281 and is stored in the capacitor 264. When the supply of the low-level potential to the node 281 is finished, the first switch 244 is turned off and the potential of the first wiring 213 is set to a low level, so that the first transistor 201 is turned off.

Figure 3:
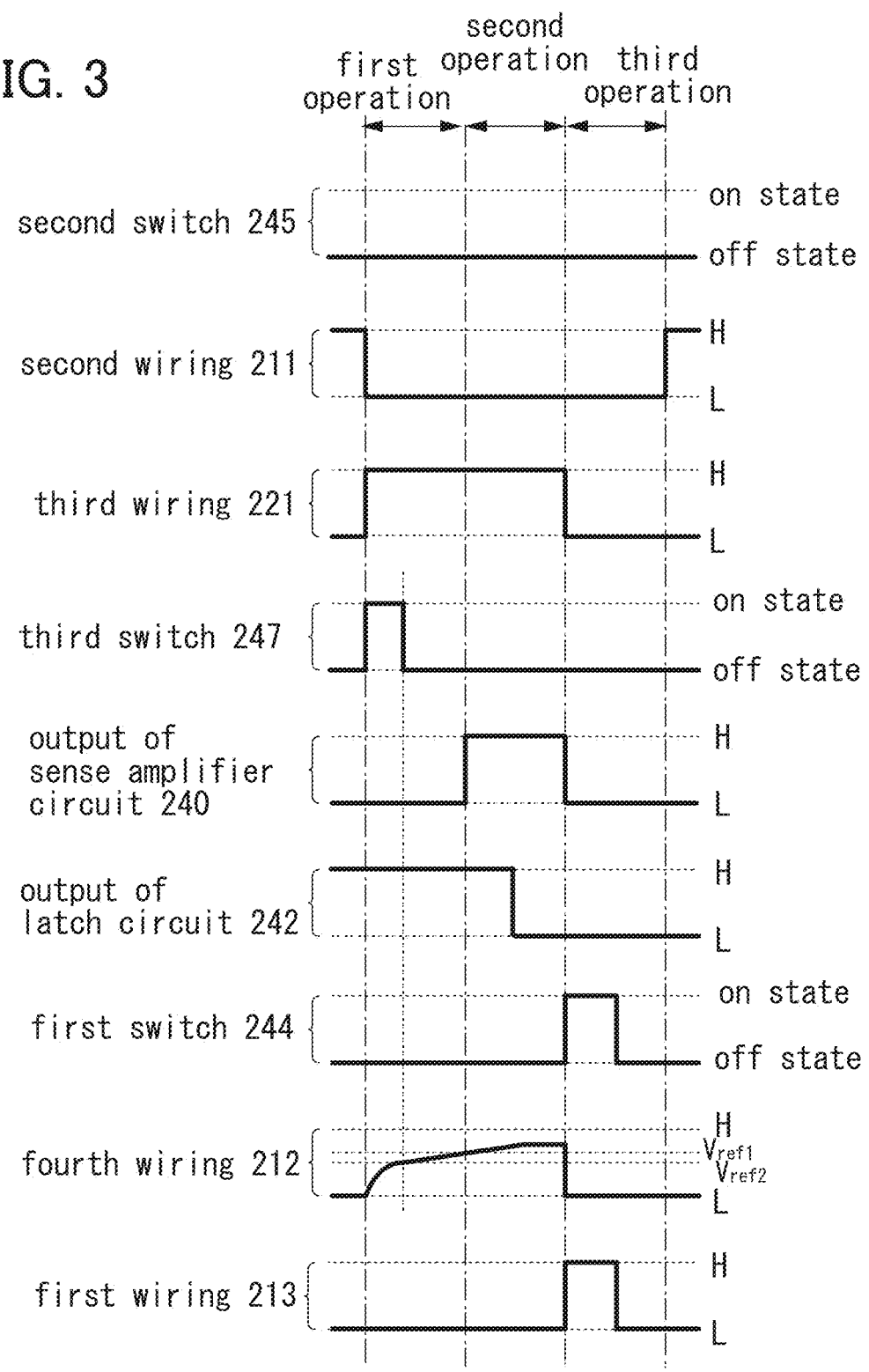
FIG. 3 is a timing chart of operations of a semiconductor device.

Although the second transistor 202 is a p-channel transistor in FIG. 1 to FIG. 3, the second transistor 202 may be an n-channel transistor. Furthermore, a semiconductor layer of the second transistor 202 is not limited to silicon, and an oxide semiconductor or another semiconductor material may be used. In the case where the semiconductor layer of the second transistor 202 is an oxide semiconductor, the same material may be used for semiconductor layers of the first transistor 201 and the second transistor 202 in order to simplify the process. Alternatively, in view of functions of the first transistor 201 for writing and functions of the second transistor 202 for reading, different oxide semiconductors may be used for the semiconductor layers.

The above refresh operation is performed every certain period which is set in advance. Through such a refresh operation, charge can be written to the node 281 again and data can be held for a longer period. Even when controlling the threshold value of the first transistor 201 is difficult and the first transistor 201 is normally on at Vg=0 V, data can be held for a long period by writing charge to the node 281 again.

Furthermore, the number of times of refresh operations in the memory using an oxide semiconductor in this embodiment is extremely smaller than that in a DRAM, and the number of times of refresh operations can be less than or equal to one millionth of that in the DRAM. For example, the DRAM requires 30 refresh operations per second; however, the memory using an oxide semiconductor in this embodiment requires only one or less refresh operations per day. Consequently, the memory in this embodiment can significantly reduce power required for refresh operations and thus can reduce power consumption.

In the case where the memory using an oxide semiconductor in this embodiment is used as a cache memory or the like, even when the cache memory is not used for a long period, refresh operations are performed at regular intervals and data can be held for a longer period.

Figure 4:
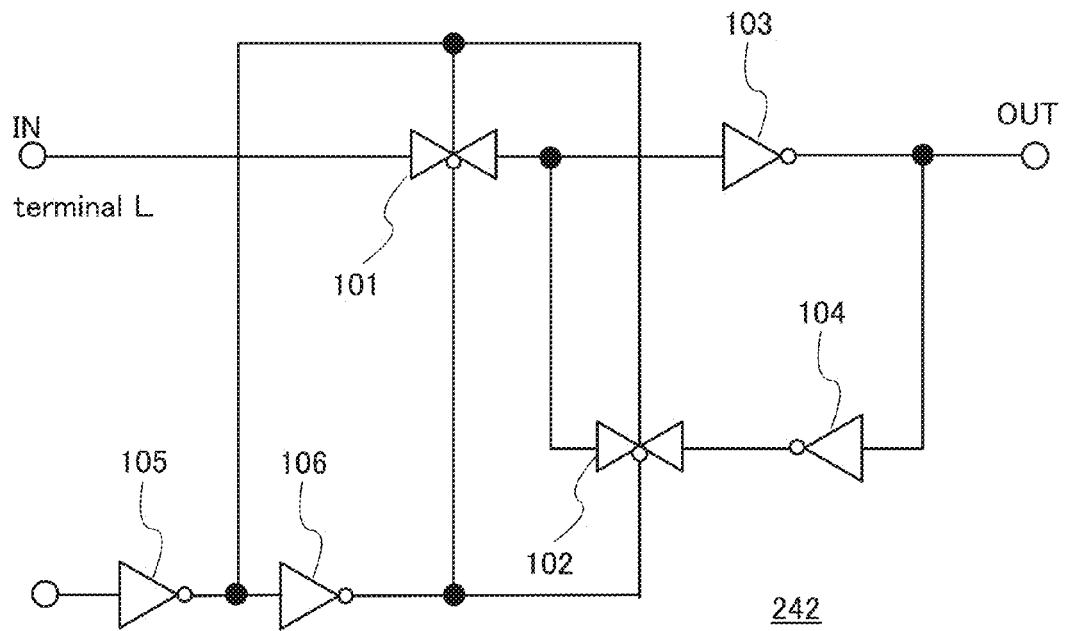
FIG. 4 is a circuit diagram of a semiconductor device.

FIG. 4 shows an example of the latch circuit 242 in FIG. 1. The latch circuit 242 includes an analog switch 101, an analog switch 102, an inverter 103, an inverter 104, an inverter 105, and an inverter 106. The output terminal of the sense amplifier circuit 240 is electrically connected to an input terminal IN, and a signal is input from the sense amplifier circuit 240 in FIG. 1 to the input terminal IN. The one terminal of the first switch 244 is electrically connected to an output terminal OUT, and the output of the latch circuit 242 is input to the first switch 244 in FIG. 1. A terminal L is a latch input terminal, and the operation of the latch circuit 242 can be controlled in accordance with a signal from the terminal L.

In the latch circuit 242 in FIG. 4, a signal input from the input terminal IN is inverted by the inverter 103 and output from the output terminal OUT.

A method for driving the latch circuit 242 is described. In the case where a low signal is input to the latch input terminal L, the analog switch 101 is turned off, the analog switch 102 is turned on, and the inverters 103 and 104 form a loop; thus, the signal from the input terminal IN is held.

In the case where a high signal is input to the latch input terminal L, the analog switch 101 is turned on, the analog switch 102 is turned off, and an inverter loop of the inverters 103 and 104 is opened; thus, the signal from the input terminal IN is not held. After that, when a low signal is input to the latch input terminal L again, the inverter loop of the inverters 103 and 104 is formed again, and the signal from the input terminal IN is latched in the inverter loop. In such a manner, the latch circuit 242 operates.

In a shift from the second operation to the third operation in FIG. 2 and FIG. 3, the potential of the fourth wiring 212 is changed from a potential higher than Vref1 to a potential lower than Vref1, or from a potential lower than Vref1 to a potential higher than Vref1. In accordance with the change in the potential of the fourth wiring 212, the output of the sense amplifier circuit 240 is also changed in the shift from the second operation to the third operation. However, when an input signal is held by forming an inverter loop in the latch circuit 242, the output of the latch circuit 242 is not affected by a change in the output of the sense amplifier circuit 240. When the output of the sense amplifier circuit 240 is to be taken in the latch circuit 242 newly, the inverter loop is opened once, the inverter loop is formed again, and then, the output of the sense amplifier circuit is taken. For example, in memory cell arrays of a plurality of rows, inverter loops of the latch circuits 242 are opened after a refresh operation is finished in memory cells of the first row, and in a refresh operation performed on memory cells of the second row, the inverter loops of the latch circuits 242 are formed again in some cases.

Note that the latch circuit in this embodiment of the present invention is not limited to that having the configuration in FIG. 4, and may be another circuit.

Embodiment 2

Figure 5:
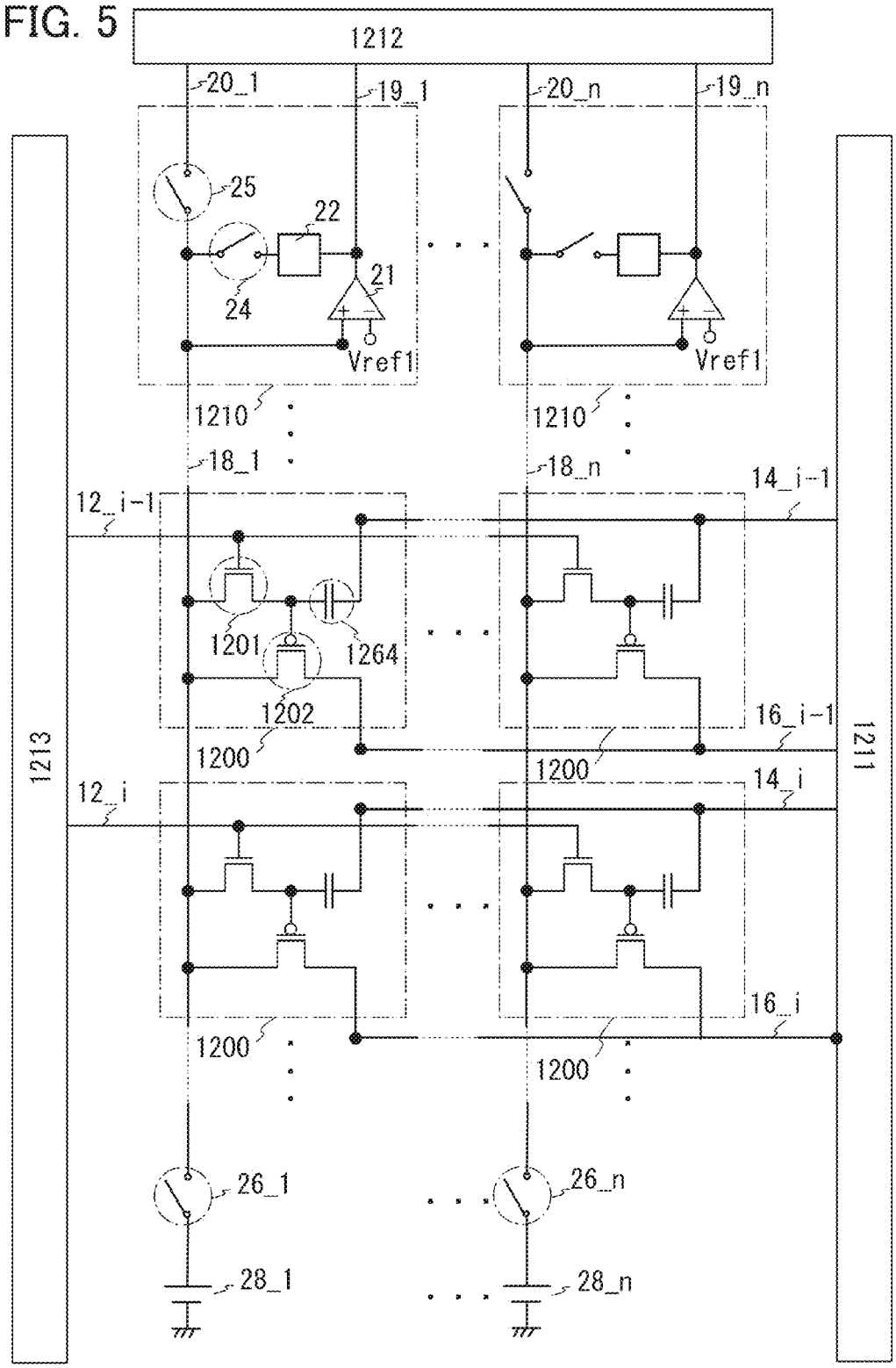
FIG. 5 is a circuit diagram of a semiconductor device.

FIG. 5 shows an example of a circuit diagram of a semiconductor device having memory capacity of m×n bits in which the semiconductor device illustrated in FIG. 1 is used.

The semiconductor device in FIG. 5 includes m first wirings 12, m second wirings 14, m third wirings 16, n fourth wirings 18, n fifth wirings 19, and n sixth wirings 20. The semiconductor device in FIG. 5 includes a memory cell array and peripheral circuits such as a first driver circuit 1211, a second driver circuit 1212, and a third driver circuit 1213. The memory cell array includes a plurality of memory cells 1200 arranged in a matrix of m rows×n columns (m and n are natural numbers). In addition, n circuits 1210 which operate in refresh operations are provided. The circuit 1210 is provided for every fourth wiring 18. A third switch 26 for precharge is provided for every fourth wiring 18. A power source 28 for precharge is also provided for every fourth wiring 18. Alternatively, one power source 28 for precharge may be provided for all of the fourth wirings 18, or the power source 28 for precharge may be shared by a plurality of fourth wirings 18. The first wirings 12, the second wirings 14, the third wirings 16, and the fourth wirings 18 are also referred to as word lines, capacitor word lines, source lines, and bit lines, respectively. Note that "i" added to the first wirings 12 to the third wirings 16 in FIG. 5 satisfies 2≤i≤m (i is a natural number) because (i−1)≤1 is satisfied in the diagram.

The first wirings 12 are electrically connected to the third driver circuit 1213. The second wirings 14 and the third wirings 16 are electrically connected to the first driver circuit 1211. The fourth wirings 18, the fifth wirings 19, and the sixth wirings 20 are electrically connected to the second driver circuit 1212. This is an example, and it may be appropriately determined that which wiring is driven by which driver circuit. For example, all of the first wirings 12 to the third wirings 16 may be driven by the same driver circuit, or the third wirings 16 may be electrically connected to the second driver circuit 1212 and may be driven by the second driver circuit 1212.

The memory cell 1200 includes a first transistor 1201 for writing which includes an oxide semiconductor in a semiconductor layer, a second transistor 1202 for reading, and a storage capacitor 1264. The memory cell 1200 is electrically connected to the first wiring 12, the second wiring 14, the third wiring 16, and the fourth wiring 18. The circuit 1210 includes a first switch 24, a sense amplifier circuit 21, a latch circuit 22, and a second switch 25. The circuit 1210 is electrically connected to the fourth wiring 18, the fifth wiring 19, and the sixth wiring 20.

Refresh operations are performed on all of the m×n memory cells 1200 every certain period. In general, refresh operations are performed on all of the memory cells 1200 in such a manner that a refresh operation is performed on the memory cells 1200 of the same row at the same time and the refresh operations are sequentially performed m times equivalent to the number of rows.

This embodiment can be implemented in combination with any of the other embodiments as appropriate.

Embodiment 3

The refresh operation is described in Embodiment 1. The semiconductor device of the present invention performs writing, reading, and holding in addition to the refresh operation. In this embodiment, operations other than the refresh operation are described with reference to FIGS. 6A to 6C, FIG. 7, and FIGS. 8A and 8B. Reference numerals of elements in FIGS. 6A to 6C are the same as those in FIG. 1.

A writing operation is described with reference to FIG. 6A and FIG. 7. An operation of writing a high signal to the node 281 is described. First, in a first operation, a high-level potential is supplied from a driver circuit to the sixth wiring 248, the second switch 245 is turned on, and then, the high signal is supplied to the fourth wiring 212.

Next, in a second operation, the potential of the first wiring 213 is set to a high level, so that the first transistor 201 is turned on. Furthermore, the potentials of the second wiring 211 and the third wiring 221 are set to a low level. Thus, a high signal is supplied to the node 281 through the first transistor 201.

Next, in a third operation, the potential of the first wiring 213 is set to a low level, so that the first transistor 201 is turned off. Charge supplied to the node 281 is held even after the first transistor 201 is turned off.

Here, when the potentials of the second wiring 211, the third wiring 221, and the fourth wiring 212 (the second to fourth wirings 211, 221, and 212) are changed before the first transistor 201 is turned off, an accurate potential might not be held at the node 281. In the case where the potentials of the second to fourth wirings 211, 221, and 212 are changed, the first transistor 201 needs to be turned off in advance. Even when the potentials of the second to fourth wirings 211, 221, and 212 are changed after the third operation, charge supplied to the node 281 remains held.

Note that the first operation and the second operation can be performed in the reverse order. In the writing operation, the first switch 244 and the third switch 247 are off.

The reading operation is described with reference to FIG. 6B and FIGS. 8A and 8B. FIGS. 8A and 8B are timing charts for describing the reading operation. The reading operation is partly similar to the refresh operation described in Embodiment 1. In the refresh operation, the output of the sense amplifier circuit 240 is supplied to the fourth wiring 212 through the latch circuit 242 and the first switch 244 again, so that charge is supplied to the node 281. In contrast, in the reading operation, the output of the sense amplifier circuit 240 is input to the driver circuit and data held at the node 281 is read by the output potential of the sense amplifier circuit 240.

An operation of the case where a high-level potential is held at the node 281 is described with reference to FIG. 8A. First, the second switch 245 is turned off so that a signal is not input from the driver circuit to the memory cell 200 through the sixth wiring 248. During the reading operation, the second switch 245 is off and the potential of the first wiring 213 is at a low level, so that the first transistor 201 is off.

Next, in a first operation, the potential of the second wiring 211 is set to a low level and the potential of the third wiring 221 is set to a high level, so that the third switch 247 is turned on at substantially the same time. Since the third switch 247 is turned on, the fourth wiring 212 and the power source 252 are electrically connected to each other; thus, the fourth wiring 212 is precharged from the power source 252. Although a high-level potential is stored at the node 281, which is the gate of the second transistor 202, the source of the second transistor 202 is also at a high level; thus, the second transistor 202 is turned off.

In the first operation, the potential Vref2 is supplied from the power source 252 to the fourth wiring 212. When the precharge is finished, the third switch 247 is turned off.

In a second operation, the output of the sense amplifier circuit 240 depending on the potential of the fourth wiring 212 is obtained. The potential of the fourth wiring 212 is input to the first input terminal of the sense amplifier circuit 240. Since the potential Vref2 of the fourth wiring 212 is lower than the reference potential Vref1, the sense amplifier circuit 240 outputs a low signal to the fifth wiring 214. Although the output of the sense amplifier circuit 240 is also input to the latch circuit 242, the output of the latch circuit 242 is not input to the memory cell 200 since the first switch 244 remains off.

FIG. 8B is a timing chart of the case where a low-level potential is held at the node 281. The timing chart in FIG. 8B is the same as that in FIG. 8A in that the potential of the second wiring 211 is set to a low level and the potential of the third wiring 221 is set to a high level in the first operation, so that the third switch 247 is turned on at substantially the same time. Since the third switch 247 is turned on, the fourth wiring 212 and the power source 252 are electrically connected to each other; thus, the fourth wiring 212 is precharged to the potential Vref2 from the power source 252.

Since the low-level potential is held at the node 281, the second transistor 202 is turned on. By turning on the second transistor 202, current flows to the fourth wiring 212; however, the potential of the fourth wiring 212 remains Vref2 because the power source 252 absorbs the current. When the precharge is finished and the third switch 247 is turned off, the potential of the fourth wiring 212 is increased since the current flows from the second transistor 202 to the fourth wiring 212.

While the third switch 247 is on in the first operation, the precharge potential Vref2 is supplied from the power source 252 to the fourth wiring 212. When the third switch 247 is turned off, the potential of the fourth wiring 212 is increased to be higher than the precharge potential Vref2 owing to the current from the second transistor 202.

When the potential of the fourth wiring 212 is higher than the reference potential Vref1, the output of the sense amplifier circuit 240 depending on the potential of the fourth wiring 212 is obtained in the second operation. Since the potential of the fourth wiring 212 is higher than the reference potential Vref1, the sense amplifier circuit 240 outputs a high signal to the fifth wiring 214.

Through the above operations, data stored at the node 281 can be read because the output of the sense amplifier circuit 240 depends on the case where a high-level potential is held at the node 281 or the case where a low-level potential is held at the node 281.

The data holding operation is described with reference to FIG. 6C. The first switch 244, the second switch 245, and the third switch 247 are turned off, and the potential of the first wiring 213 is set to a low level, so that the first transistor 201 is turned off. In such a manner, charge can be held at the node 281.

This embodiment can be implemented in combination with any of the other embodiments as appropriate.

Embodiment 4

In this embodiment, an oxide semiconductor layer that can be used as a semiconductor layer of the first transistor for writing which has low off-state current described in the above embodiment is described. An oxide semiconductor layer described below can be used as channel layers of transistors other than the first transistor for writing, e.g., a second transistor for reading, first to third switches, or transistors used in a sense amplifier circuit and a latch circuit.

An oxide semiconductor used for a channel formation region in the semiconductor layer of the first transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer of the first transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, or 2:1:3, or an oxide with an atomic ratio close to the above atomic ratios can be used.

When the oxide semiconductor film forming the semiconductor layer contains a large amount of hydrogen, the hydrogen and the oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, further preferably less than or equal to $1\times10^{-24}$ A; or at 85° C., less than or equal to $1\times10^{-15}$ A, preferably less than or equal to $1\times10^{-18}$ A, further preferably less than or equal to $1\times10^{-21}$ A. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

The oxide semiconductor film may include one or more of an oxide semiconductor having a single-crystal structure (hereinafter referred to as a single-crystal oxide semiconductor), an oxide semiconductor having a polycrystalline structure (hereinafter referred to as a polycrystalline oxide semiconductor), an oxide semiconductor having a microcrystalline structure (hereinafter referred to as a microcrystalline oxide semiconductor), and an oxide semiconductor having an amorphous structure (hereinafter referred to as an amorphous oxide semiconductor). Alternatively, the oxide semiconductor film may be formed using a CAAC-OS film. Alternatively, the oxide semiconductor film may include an amorphous oxide semiconductor and an oxide semiconductor having a crystal grain. Described below are a CAAC-OS and a microcrystalline oxide semiconductor as typical examples.

First, a CAAC-OS film is described.

The CAAC-OS film is an oxide semiconductor film having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

Figure 9A:
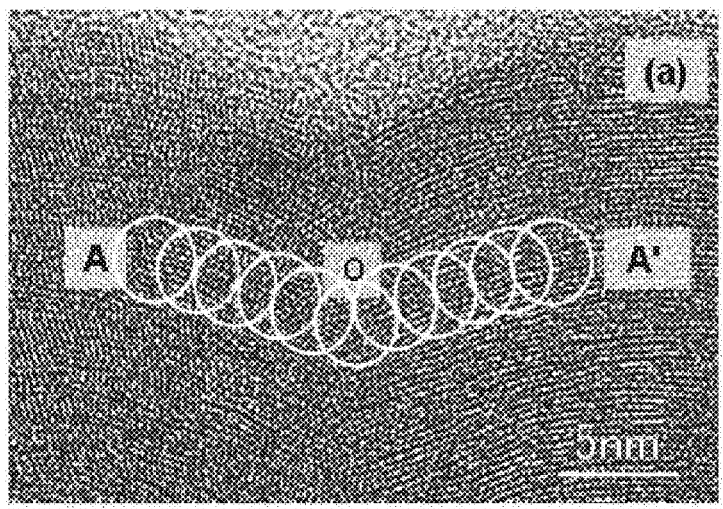
FIGS. 9A to 9C are cross-sectional TEM images and a local Fourier transform image of an oxide semiconductor.
Figure 9B:

FIG. 9A is a cross-sectional TEM image of a CAAC-OS film. FIG. 9B is a cross-sectional TEM image obtained by enlarging the image of FIG. 9A. In FIG. 9B, atomic arrangement is highlighted for easy understanding.

Figure 9C:
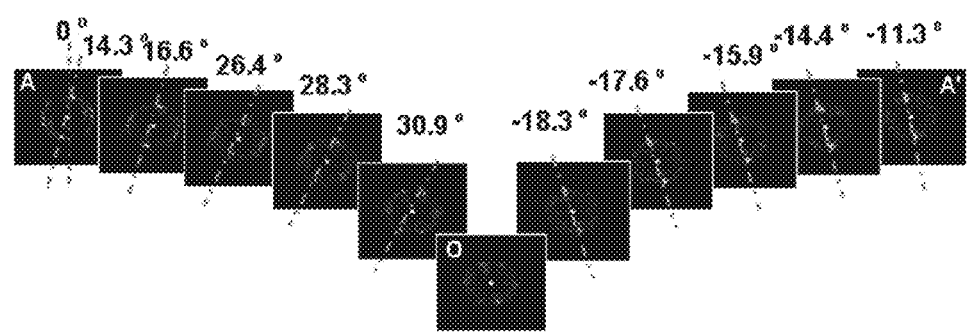

FIG. 9C is Fourier transform images of regions each surrounded by a circle (the diameter is approximately 4 nm) between A and O and between O and A' in FIG. 9A. C-axis alignment can be observed in each region in FIG. 9C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, the angle of the c-axis between 0 and A' continuously changes, for example, −18.3°, −17.6°, and −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 10A).

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm or more, 5 $\mu m^2$ or more, or 1000 $\mu m^2$ or more is observed in some cases in the plan-view TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variation in electrical characteristics and high reliability. Charge trapped by the carrier traps in the oxide semiconductor film takes a long time to be released, and might behave like fixed charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

Next, a microcrystalline oxide semiconductor film is described.

In an image obtained with the TEM, crystal parts cannot be found clearly in the microcrystalline oxide semiconductor film in some cases. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 10B).

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 10A:
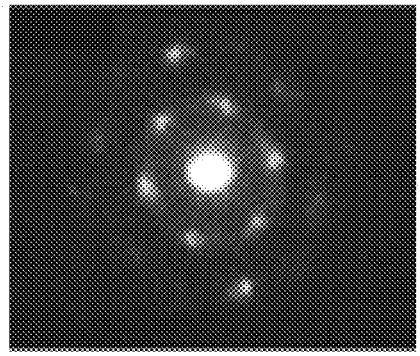
FIGS. 10A and 10B show nanobeam electron diffraction patterns of oxide semiconductor films and FIGS. 10C and 10D illustrate an example of a transmission electron diffraction measurement apparatus.
Figure 10B:
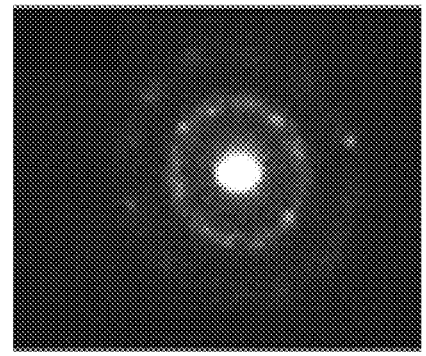
Figure 10C:
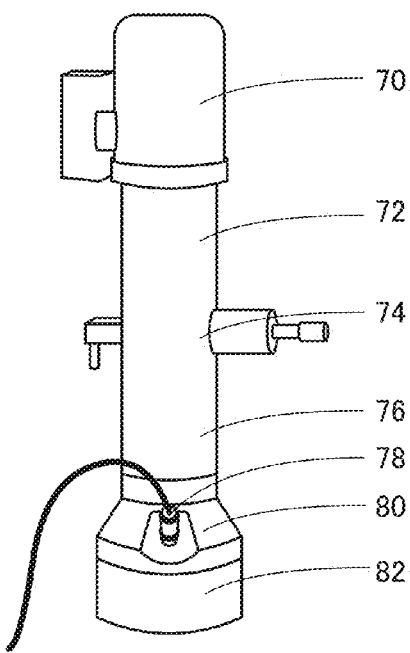

FIG. 10C illustrates a transmission electron diffraction measurement apparatus. The transmission electron diffraction measurement apparatus includes an electron gun chamber 70, an optical system 72 below the electron gun chamber 70, a sample chamber 74 below the optical system 72, an optical system 76 below the sample chamber 74, an observation chamber 80 below the optical system 76, a camera 78 provided for the observation chamber 80, and a film chamber 82 below the observation chamber 80. The camera 78 is provided to face toward the inside of the observation chamber 80. Note that the film chamber 82 is not necessarily provided.

Figure 10D:
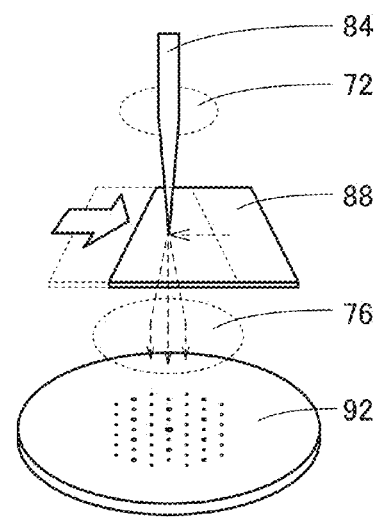

FIG. 10D illustrates the internal structure of the transmission electron diffraction measurement apparatus in FIG. 10C. In the transmission electron diffraction measurement apparatus, a substance 88 which is positioned in the sample chamber 74 is irradiated with electrons emitted from an electron gun installed in the electron gun chamber 70 through the optical system 72. The electrons which have passed through the substance 88 enter a fluorescent plate 92 which is installed in the observation chamber 80 through the optical system 76. On the fluorescent plate 92, a pattern corresponding to the intensity of the incident electron appears, which enables measurement of a transmission electron diffraction pattern.

The camera 78 is installed so as to face the fluorescent plate 92 and can take a picture of a pattern appearing in the fluorescent plate 92. An angle formed by a straight line which passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In this case, a transmission electron diffraction pattern with less distortion can be taken from the rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 88.

Then, a method for measuring a transmission electron diffraction pattern of a substance by the transmission electron diffraction measurement apparatus described above is described.

For example, changes in the structure of a substance can be observed by changing the irradiation position of the electrons 84 that are a nanobeam on the substance (or by scanning) as illustrated in FIG. 10D. At this time, when the substance 88 is a CAAC-OS film, a diffraction pattern shown in FIG. 10A is observed. When the substance 88 is an nc-OS film, a diffraction pattern shown in FIG. 10B is observed Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 11A:
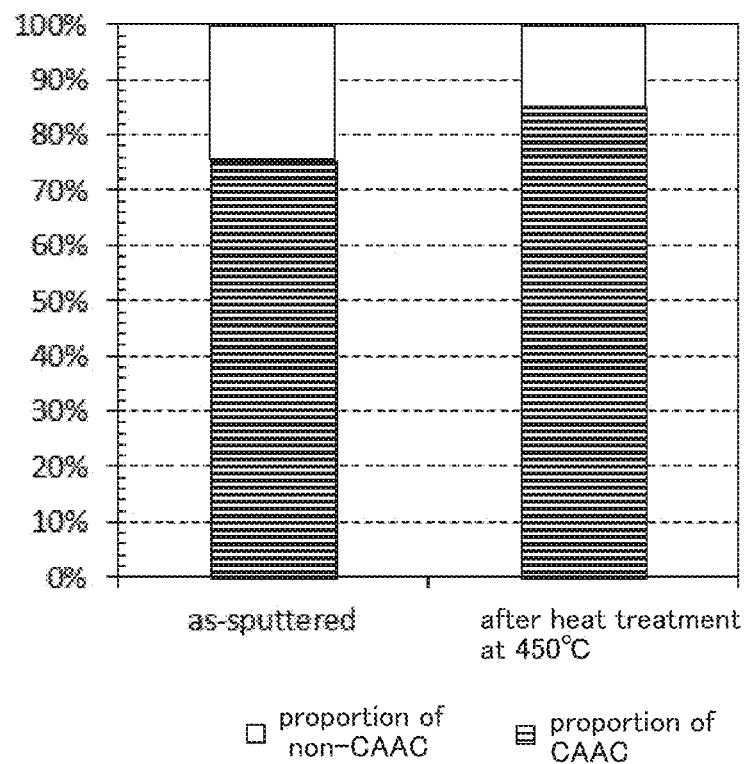
FIG. 11A shows an example of structural analysis by transmission electron diffraction measurement and FIGS. 11B and 11C are plan-view TEM images.

FIG. 11A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 11B:
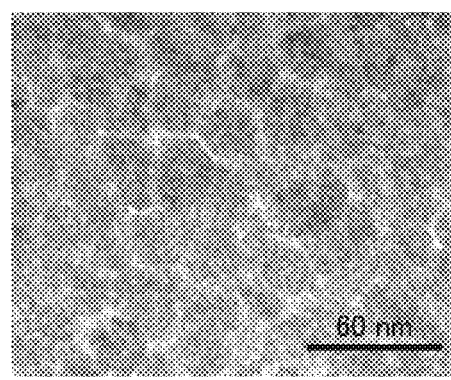
Figure 11C:
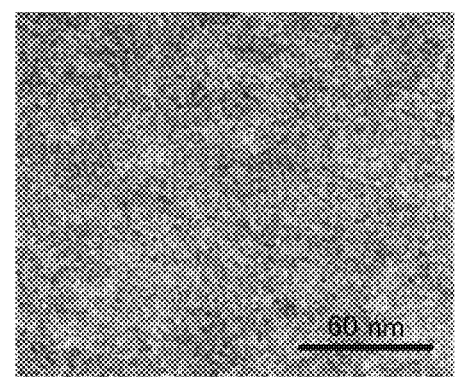

FIGS. 11B and 11C are plan-view TEM images of the CAAC-OS film obtained just after the deposition and the CAAC-OS film subjected to the heat treatment at 450° C., respectively. Comparison between FIGS. 11B and 11C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

With the use of the oxide semiconductor film in this embodiment as the semiconductor layer of the first transistor for writing, the first transistor having extremely favorable off-state current characteristics can be obtained. With the use of the CAAC-OS film in this embodiment as the semiconductor layer of the first transistor for writing, the first transistor for writing having high reliability and smaller variations in electrical characteristic can be obtained. Thus, when the first transistor for writing which includes the oxide semiconductor layer in this embodiment and the circuit related to the refresh operation described in Embodiment 1 are provided, a semiconductor device having an extremely long data retention period can be provided.

This embodiment can be implemented in combination with any of the other embodiments as appropriate.

Embodiment 5

In this embodiment, an example of a cross-sectional structure of a transistor used in a semiconductor device of one embodiment of the disclosed invention is described with reference to drawings.

Figure 12:
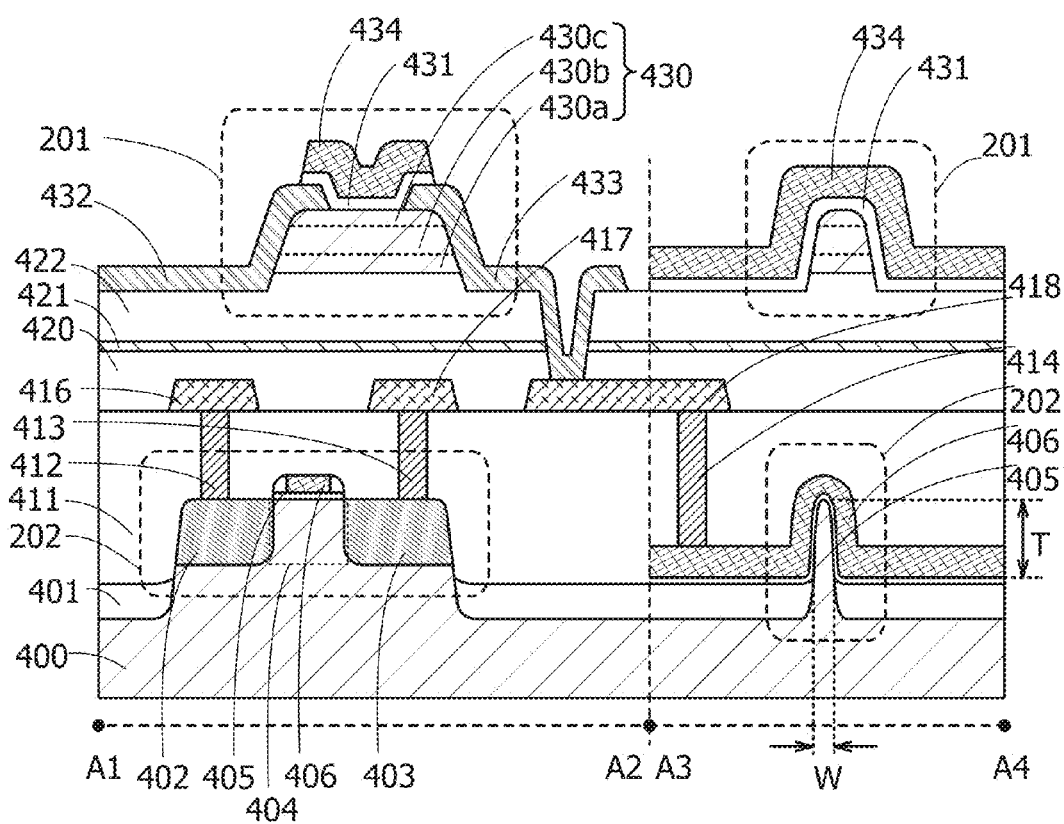
FIG. 12 is a cross-sectional view illustrating one embodiment of the present invention.

FIG. 12 illustrates an example of part of a cross-sectional structure of a circuit portion of one embodiment of the disclosed invention. FIG. 12 illustrates an example of a cross-sectional structure of the first transistor 201 for writing and the second transistor 202 for reading illustrated in FIG. 1 in Embodiment 1. A region along dashed line A1-A2 shows a structure of the first transistor 201 and the second transistor 202 in the channel length direction, and a region along dashed line A3-A4 shows a structure of the first transistor 201 and the second transistor 202 in the channel width direction. Note that in one embodiment of the present invention, the channel length direction of the first transistor 201 does not necessarily correspond to the channel length direction of the second transistor 202.

The channel length direction denotes a direction in which carriers move at the shortest distance between a pair of impurity regions serving as a source region and a drain region. The channel width direction denotes a direction perpendicular to the channel length direction.

FIG. 12 illustrates an example in which the first transistor 201 including a channel formation region in an oxide semiconductor film is formed over the second transistor 202 including a channel formation region in a single crystal silicon substrate. With the structure illustrated in FIG. 12, the first transistor 201 and the second transistor 202 can overlap with each other. Alternatively, the channel formation region of the first transistor 201 and the channel formation region of the second transistor 202 can overlap with each other. Thus, the structure can reduce the layout area of a semiconductor device.

The second transistor 202 may include a channel formation region in a semiconductor film or a semiconductor substrate of silicon, germanium, or the like in an amorphous, microcrystalline, polycrystalline, or single crystal state. Alternatively, the second transistor 202 may include the channel formation region in an oxide semiconductor film or an oxide semiconductor substrate. In the case where the transistors each include a channel formation region in an oxide semiconductor film or an oxide semiconductor substrate, the first transistor 201 is not necessarily stacked over the second transistor 202, and the first transistor 201 and the second transistor 202 may be formed in the same layer.

In the case where the second transistor 202 is formed using a thin silicon film, any of the following can be used in the thin film: amorphous silicon formed by a sputtering method or a vapor phase growth method such as a plasma-enhanced chemical vapor deposition (CVD) method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A substrate 400 where the second transistor 202 is formed can be, for example, a silicon substrate, a germanium substrate, or a silicon germanium substrate. In FIG. 12, a single crystal silicon substrate is used as the substrate 400.

The second transistor 202 is electrically isolated by element isolation. Trench isolation (e.g., shallow trench isolation (STI)) or the like can be used as the element isolation. In FIG. 12, the second transistor 202 is electrically isolated by trench isolation. Specifically, in FIG. 12, the second transistor 202 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the second transistor 202 and a channel formation region 404 placed between the impurity regions 402 and 403 are provided. The second transistor 202 also includes an insulating film 405 covering the channel formation region 404 and a gate electrode 406 that overlaps the channel formation region 404 with the insulating film 405 placed therebetween.

In the second transistor 202, a side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the area of the second transistor 202 in the substrate can be small, and the amount of transfer of carriers in the second transistor 202 can be increased. As a result, the on-state current and field-effect mobility of the second transistor 202 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the second transistor 202 can be further increased and the field-effect mobility of the second transistor 202 can be further increased.

Note that in the case of the second transistor 202 formed using a bulk semiconductor substrate, the aspect ratio is preferably 0.5 or more, more preferably 1 or more.

An insulating film 411 is provided over the second transistor 202. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the first transistor 201 is provided over the insulating film 422.

The first transistor 201 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 therebetween. Note that an opening is formed in the insulating films 420 to 422. The conductive film 433 is connected to the conductive film 418 in the opening.

Note that in FIG. 12, the first transistor 201 includes at least the gate electrode 434 on one side of the semiconductor film 430, and may further include a gate electrode overlapping with the semiconductor film 430 with the insulating film 422 positioned therebetween.

When the first transistor 201 includes a pair of gate electrodes, a signal for controlling an on state or an off state may be input to one of the gate electrodes, and the other of the gate electrodes may be supplied with a potential. In that case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 12, the first transistor 201 has a single-gate structure in which one channel formation region corresponding to one gate electrode 434 is provided. However, the first transistor 201 may have a multi-gate structure where a plurality of electrically connected gate electrodes are provided so that a plurality of channel formation regions are included in one active layer.

FIG. 12 illustrates an example in which the semiconductor film 430 included in the first transistor 201 includes oxide semiconductor films 430a to 430c that are stacked in this order over the insulating film 422. Note that in one embodiment of the present invention, the semiconductor film 430 of the first transistor 201 may be formed using a single-layer metal oxide film.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma-enhanced CVD method, a sputtering method, or the like.

Note that in this specification, oxynitride contains more oxygen than nitrogen, and nitride oxide contains more nitrogen than oxygen.

Note that in the first transistor 201 illustrated in FIG. 12, the gate electrode 434 overlaps with end portions of the oxide semiconductor film 430b including a channel region that are not overlapped with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portion of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that are not overlapped with the conductive films 432 and 433 are overlapped with the gate electrode 434 in the first transistor 201 illustrated in FIG. 12. Consequently, current that flows between the conductive films 432 and 433 through the end portions of the oxide semiconductor film 430b can be controlled by the potential applied to the gate electrode 434. This structure of the first transistor 201 is referred to as a surrounded channel (s-channel) structure.

With the s-channel structure, specifically, when a potential at which the first transistor 201 is turned off is supplied to the gate electrode 434, the amount of off-state current that flows between the conductive films 432 and 433 through the end portions of the oxide semiconductor film 430b can be reduced. For this reason, in the first transistor 201, even when the distance between the conductive films 432 and 433 at the end portions of the oxide semiconductor film 430b is reduced as a result of reducing the channel length to obtain high on-state current, the first transistor 201 can have low off-state current. Consequently, with the short channel length, the first transistor 201 can have high on-state current when in an on state and low off-state current when in an off state.

With the s-channel structure, specifically, when a potential at which the first transistor 201 is turned on is supplied to the gate electrode 434, the amount of current that flows between the conductive films 432 and 433 through the end portions of the oxide semiconductor film 430b can be increased. The current contributes to an increase in the field-effect mobility and on-state current of the first transistor 201. When the end portions of the oxide semiconductor film 430b are overlapped with the gate electrode 434, carriers flow in a wide region of the oxide semiconductor film 430b without being limited to a region in the vicinity of the interface between the oxide semiconductor film 430b and the gate insulating film 431, which results in an increase in carrier mobility of the first transistor 201. As a result, the on-state current of the first transistor 201 is increased, and the field-effect mobility is increased. Typically, the field-effect mobility is greater than or equal to 10 $cm^2V/s$ or greater than or equal to 20 $cm^2V/s$. Note that here, the field-effect mobility is not an approximate value of the mobility as the physical property of the oxide semiconductor film but is an index of current drive capability and the apparent field-effect mobility of a saturation region of the transistor.

Figure 13:
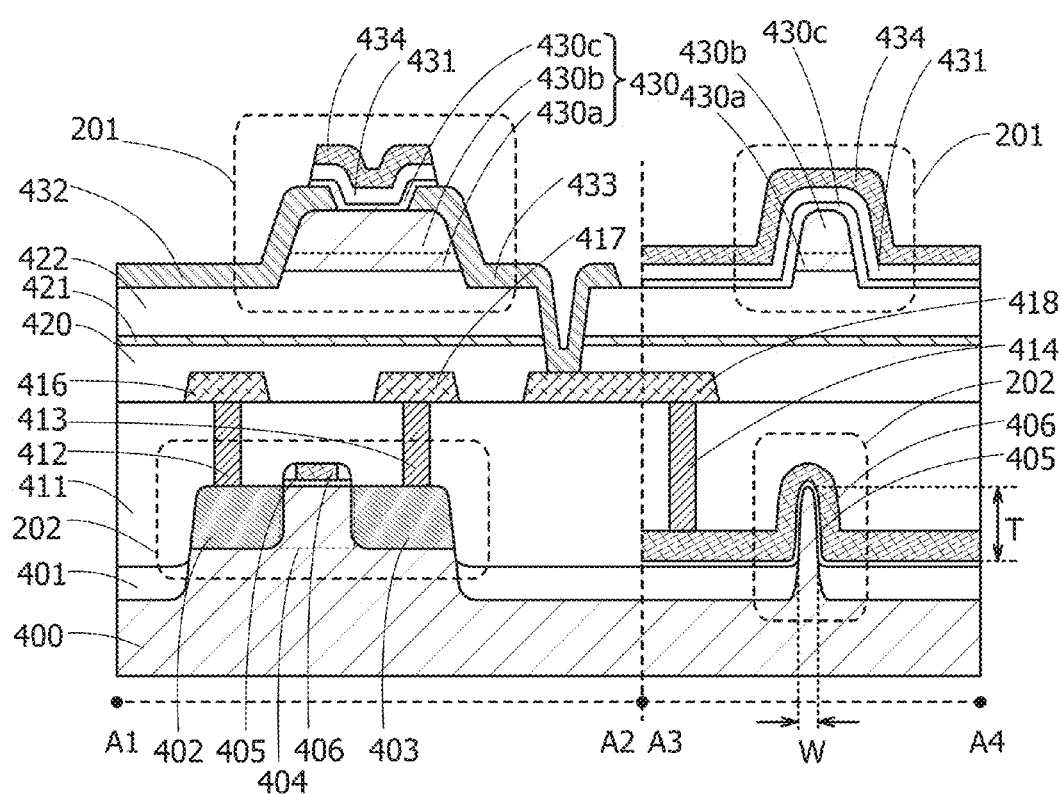
FIG. 13 is a cross-sectional view illustrating one embodiment of the present invention.

Although this embodiment is described with reference to FIG. 12, one embodiment of the present invention is not limited to this structure. For example, a structure illustrated in FIG. 13 may be employed.

With the use of the above-described miniaturized transistor for a memory cell or a circuit which operates in a refresh operation, a memory device or a semiconductor device capable of high-speed operation can be manufactured.

This embodiment can be implemented in combination with any of the other embodiments as appropriate.

Embodiment 6

Although the conductive film and the semiconductor film described in the above embodiments can be formed by a sputtering method, they may be formed by another method, for example, a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The conductive film and the semiconductor film which are described in the above embodiment can be formed by a thermal CVD method such as an MOCVD method or an ALD method. For example, in the case where an $InGaZnO_x$ (X>0) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $(CH_3)_2Zn$. Without limitation to the above combination, triethylgallium (chemical formula: $(C_2H_5)_3Ga$) can be used instead of trimethylgallium and diethylzinc (chemical formula: $(C_2H_5)_2Zn$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an $InGaZnO_x$ (X>0) film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Alternatively, a $Zn(CH_3)_2$ gas may be used.

This embodiment can be implemented in combination with any of the other embodiments as appropriate.

Embodiment 7

In this embodiment, application examples of the semiconductor device described in the above embodiments to an electronic component and to an electronic device including the electronic component are described with reference to FIGS. 14A and 14B and FIGS. 15A to 15E.

Figure 14A:
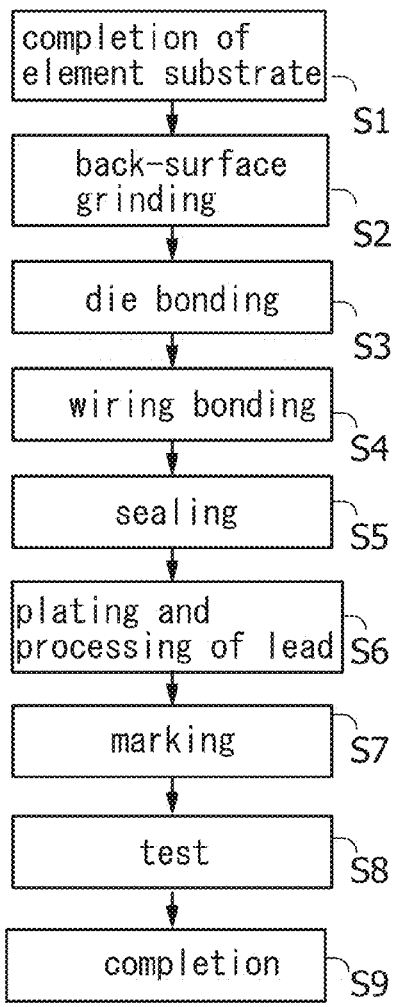
FIG. 14A is a flowchart showing a manufacturing process of an electronic component.

FIG. 14A shows an example where the semiconductor device described in the above embodiments is used to make an electronic component. Note that the electronic component is also referred to as a semiconductor package or an IC package. This electronic component has a plurality of standards and names depending on a terminal extraction direction and a terminal shape. Thus, examples of the electronic component are described in this embodiment.

A semiconductor device including the transistors illustrated in FIG. 12 of Embodiment 5 is completed by integrating detachable components on a printed circuit board through the assembly process (post-process).

The post-process can be completed through steps shown in FIG. 14A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate to separate the substrate into a plurality of chips is performed. Then, a die bonding step of individually picking up separate chips to be mounted on and bonded to a lead frame is performed (Step S3). To bond a chip and a lead frame in the die bonding step, a method such as resin bonding or tape-automated bonding is selected as appropriate depending on products. Note that in the die bonding step, a chip may be mounted on an interposer to be bonded.

Next, wiring bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). Through the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The above electronic component can include the semiconductor device described in the above embodiments. Thus, the electronic component which achieves reduction in size and cost can be obtained.

Figure 14B:
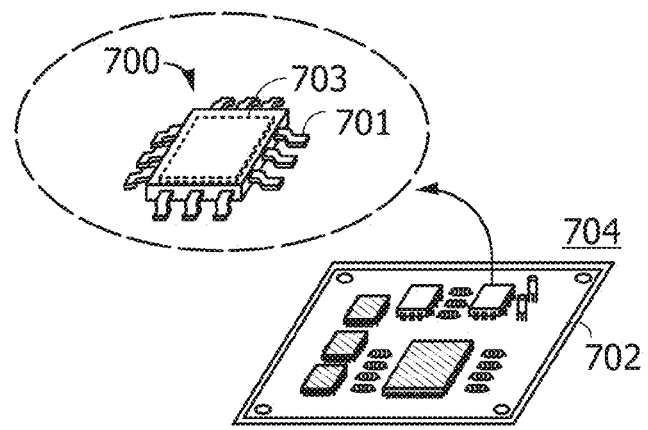
FIG. 14B is a schematic perspective view of the electronic component.

FIG. 14B is a schematic perspective view of the completed electronic component. FIG. 14B is a schematic perspective view illustrating a quad flat package (QFP) as an example of the electronic component. A lead 701 and a circuit portion 703 of an electronic component 700 are illustrated in FIG. 14B. The electronic component 700 in FIG. 14B is, for example, mounted on a printed circuit board 702. When a plurality of electronic components 700 are used in combination and electrically connected to each other over the printed circuit board 702, the electronic components 700 can be mounted on an electronic device. A completed circuit board 704 is provided in the electronic device or the like.

Then, applications of the electronic component to an electronic device such as a computer, a portable information terminal (including a mobile phone, a portable game machine, an audio reproducing device, and the like), electronic paper, a television device (also referred to as a television or a television receiver), or a digital video camera are described.

Figure 15A:
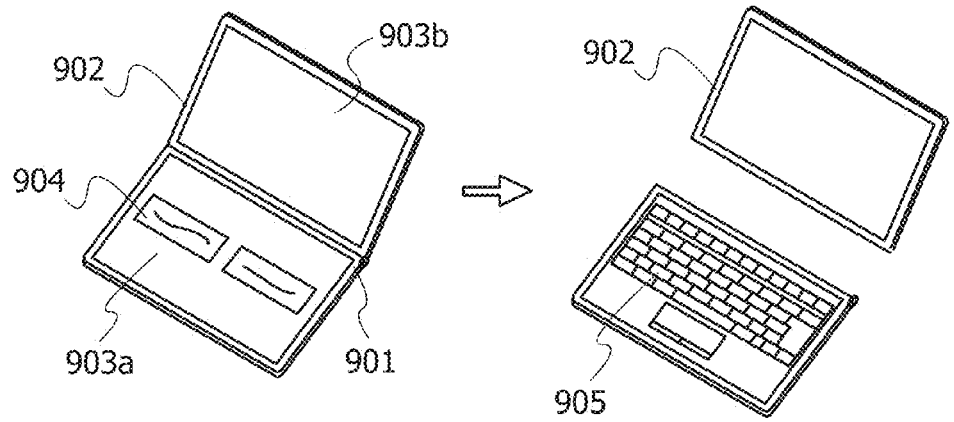
FIGS. 15A to 15E are electronic devices using electronic components.

FIG. 15A illustrates a portable information terminal, which includes a housing 901, a housing 902, a first display portion 903a, a second display portion 903b, and the like. An electronic component including the semiconductor device described in the above embodiments is provided in at least one of the housings 901 and 902. Thus, the portable information terminal can consume less power and operate at high speed.

Note that the first display portion 903a is a panel having a touch input function, and for example, as illustrated in the left of FIG. 15A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 15A. With the keyboard 905, letters can be input quickly by keyboard input as in the case of using a conventional information terminal, for example.

Furthermore, one of the first display portion 903a and the second display portion 903b can be detached from the portable information terminal as illustrated in the right of FIG. 15A. Providing the second display portion 903b with a touch input function makes the information terminal convenient to carry because the weight can be further reduced and the information terminal can operate with one hand while the other hand supports the housing 902.

The portable information terminal in FIG. 15A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (e.g., an earphone terminal or a USB terminal), a recording medium insertion portion, and the like may be provided on the rear surface or the side surface of the housing.

The portable information terminal in FIG. 15A may transmit and receive data wirelessly. Through wireless communication, desired book data or the like can be purchased and downloaded from an electronic book server.

Furthermore, the housing 902 in FIG. 15A may have an antenna, a microphone function, or a wireless communication function to be used as a mobile phone.

Figure 15B:
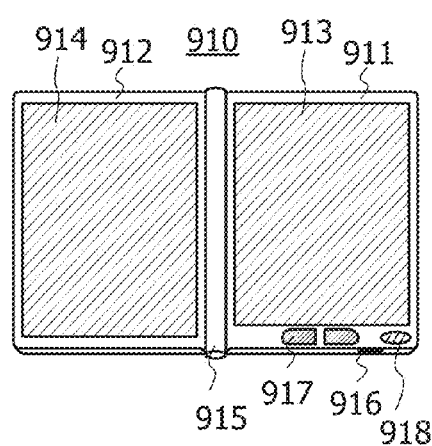

FIG. 15B illustrates an e-book reader 910 including electronic paper. The e-book reader 910 includes two housings 911 and 912. The housing 911 and the housing 912 are provided with a display portion 913 and a display portion 914, respectively. The housings 911 and 912 are connected by a hinge portion 915 and can be opened and closed with the hinge portion 915 as an axis. The housing 911 is provided with a power switch 916, an operation key 917, a speaker 918, and the like. An electronic component including the semiconductor device is provided in at least one of the housings 911 and 912. Thus, the e-book reader can consume less power and operate at high speed.

Figure 15C:
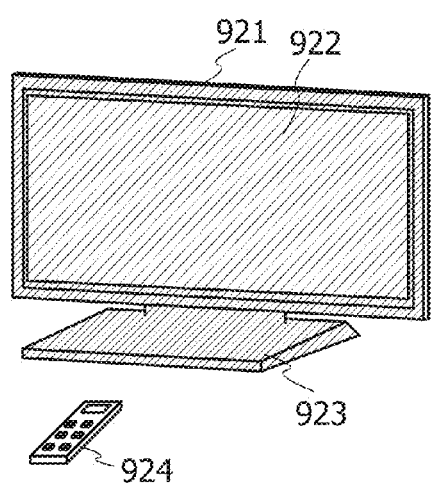

FIG. 15C is a television device, which includes a housing 921, a display portion 922, a stand 923, and the like. The television device 920 can operate with a switch of the housing 921 and a separate remote controller 924. An electronic component including the semiconductor device described in the above embodiments is provided in the housing 921 and the remote controller 924. Thus, the television device can consume less power and operate at high speed.

Figure 15D:
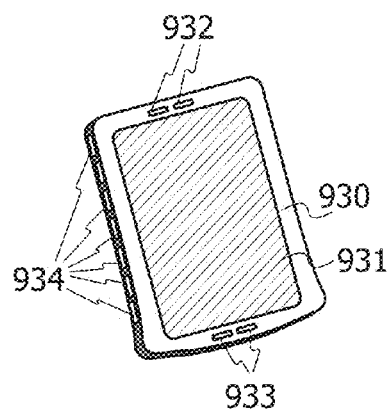

FIG. 15D illustrates a smartphone in which a main body 930 includes a display portion 931, a speaker 932, a microphone 933, operation buttons 934, and the like. An electronic component including the semiconductor device described in the above embodiments is provided in the main body 930. Thus, the smart phone can consume less power and operate at high speed.

Figure 15E:
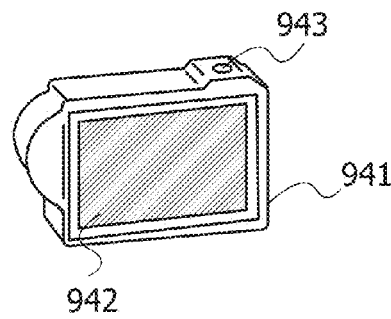

FIG. 15E illustrates a digital camera, which includes a main body 941, a display portion 942, an operation switch 943, and the like. An electronic component including the semiconductor device described in the above embodiments is provided in the main body 941. Thus, the digital camera can consume less power and operate at high speed.

As described above, an electronic component including the semiconductor device described in the above embodiments is provided in each of the electronic devices described in this embodiment. Thus, the electronic devices can consume less power and operate at high speed.

For example, in this specification and the like, when it is explicitly described that X and Y are connected, the case where X and Y are electrically connected, the case where X and Y are functionally connected, and the case where X and Y are directly connected are included therein. Accordingly, a connection relation other than connection relations shown in the drawings and texts is also included, without being limited to a predetermined connection relation, for example, a connection relation shown in the drawings and texts.

Here, X and Y each denote an object (e.g., a device, an element, a circuit, a wiring, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-049981 filed with Japan Patent Office on Mar. 13, 2014, the entire contents of which are hereby incorporated by reference.

What is claimed is:

1. A semiconductor device comprising:
a memory cell;
a sense amplifier circuit;
a latch circuit;
a first switch;
a second switch; and
a driver circuit,
wherein the sense amplifier circuit, the latch circuit, the first switch, and the second switch operate in a refresh operation of the memory cell,
wherein the memory cell includes a first transistor, a second transistor, and a capacitor,
wherein the first transistor includes an oxide semiconductor in a channel formation region,
wherein one of a source and a drain of the first transistor is electrically connected to a first wiring,
wherein the other of the source and the drain of the first transistor is electrically connected to one terminal of the capacitor,
wherein the other of the source and the drain of the first transistor is electrically connected to a gate of the second transistor,
wherein one of a source and a drain of the second transistor is electrically connected to the first wiring,
wherein a gate of the first transistor is electrically connected to a second wiring,
wherein the other terminal of the capacitor is electrically connected to a third wiring,
wherein the other of the source and the drain of the second transistor is electrically connected to a fourth wiring,
wherein a first input terminal of the sense amplifier circuit is electrically connected to the first wiring,
wherein an output terminal of the sense amplifier circuit is directly connected to an input terminal of the latch circuit,
wherein the output terminal of the sense amplifier circuit is directly connected to a fifth wiring which is different from the first wiring,
wherein an output terminal of the latch circuit is electrically connected to one terminal of the first switch,
wherein the other terminal of the first switch is electrically connected to the first wiring,
wherein one terminal of the second switch is electrically connected to the first wiring,
wherein the other terminal of the second switch is electrically connected to the driver circuit,
wherein the fifth wiring is directly connected to the driver circuit, and
wherein the first transistor and the second transistor share the first wiring.

2. The semiconductor device according to claim 1, in the refresh operation,
wherein a first potential is a potential of the first wiring which reflects a potential of the gate of the second transistor,
wherein the first potential is input to the first input terminal of the sense amplifier circuit,
wherein the sense amplifier circuit outputs a signal to the latch circuit when the first potential is input to the sense amplifier circuit,
wherein an output of the sense amplifier circuit is input to the latch circuit, and a latch operation is performed, and
wherein a second potential output from the latch circuit is input to the gate of the second transistor and the one terminal of the capacitor through the first switch, the first wiring, and the first transistor.

3. The semiconductor device according to claim 1, wherein the oxide semiconductor included in the first transistor comprises indium and zinc.

4. The semiconductor device according to claim 1, wherein the latch circuit includes an inverter.

5. The semiconductor device according to claim 1, wherein the latch circuit includes a first inverter, a second inverter, a third inverter, a fourth inverter, a first analog switch, and a second analog switch.

6. The semiconductor device according to claim 5, wherein the first analog switch is electrically connected to the output terminal of the sense amplifier circuit and the first inverter is electrically connected to the first analog switch.

7. The semiconductor device according to claim 6, wherein the first inverter and the second inverter are configured to form a loop.

8. The semiconductor device according to claim 7, wherein the first inverter is electrically connected to the first switch.

9. The semiconductor device according to claim 8, wherein the second analog switch is electrically connected to the second inverter and the first analog switch.

10. The semiconductor device according to claim 9, wherein the third inverter is electrically connected to the fourth inverter, and the fourth inverter is electrically connected to the first analog switch and the second analog switch.

11. The semiconductor device according to claim 1, wherein the number of the sense amplifier circuit is the same as the number of the latch circuit.

* * * * *